(12) United States Patent
Mitarai et al.

(10) Patent No.: US 11,355,465 B2
(45) Date of Patent: Jun. 7, 2022

(54) SEMICONDUCTOR DEVICE INCLUDING GLASS SUBSTRATE HAVING IMPROVED RELIABILITY AND METHOD OF MANUFACTURING THE SAME

(71) Applicant: SONY SEMICONDUCTOR SOLUTIONS CORPORATION, Kanagawa (JP)

(72) Inventors: Shun Mitarai, Kanagawa (JP); Shusaku Yanagawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 95 days.

(21) Appl. No.: 16/753,193

(22) PCT Filed: Sep. 27, 2018

(86) PCT No.: PCT/JP2018/035840
§ 371 (c)(1),
(2) Date: Apr. 2, 2020

(87) PCT Pub. No.: WO2019/073801
PCT Pub. Date: Apr. 18, 2019

(65) Prior Publication Data
US 2020/0321301 A1    Oct. 8, 2020

(30) Foreign Application Priority Data
Oct. 11, 2017    (JP) .............................. JP2017-197727

(51) Int. Cl.
*H01L 21/48* (2006.01)
*H01L 23/31* (2006.01)
(Continued)

(52) U.S. Cl.
CPC .......... *H01L 24/24* (2013.01); *H01L 21/4846* (2013.01); *H01L 21/568* (2013.01);
(Continued)

(58) Field of Classification Search
CPC ............. H01L 21/4846; H01L 23/3107; H01L 23/5389; H01L 24/82
(Continued)

(56) References Cited

U.S. PATENT DOCUMENTS

2002/0180027 A1\* 12/2002 Yamaguchi .......... H05K 3/4688
257/700
2005/0077601 A1\* 4/2005 Yu ........................ H01L 51/529
257/675
(Continued)

FOREIGN PATENT DOCUMENTS

CN    1956183 A    5/2007
EP    1780790 A2    5/2007
(Continued)

OTHER PUBLICATIONS

International Search Report and Written Opinion of PCT Application No. PCT/JP2018/035840, dated Nov. 27, 2018, 12 pages of ISRWO.
(Continued)

*Primary Examiner* — Didarul A Mazumder
(74) *Attorney, Agent, or Firm* — Chip Law Group

(57) ABSTRACT

The present technology relates to a semiconductor device and a method of manufacturing the same capable of improving reliability of a glass substrate on which a wiring layer is formed. A semiconductor device is provided with a glass substrate on a front surface or front and back surfaces of which a wiring layer including one or more layers of wiring is formed, an electronic component arranged inside a glass opening formed on the glass substrate, and a redistribution
(Continued)

layer that connects the wiring of the glass substrate and the electronic component. The present technology is applicable to, for example, a high-frequency front-end module and the like.

17 Claims, 14 Drawing Sheets

(51) Int. Cl.
*H01L 23/538* (2006.01)
*H01L 23/00* (2006.01)
*H01L 21/56* (2006.01)
*H01L 23/498* (2006.01)

(52) U.S. Cl.
CPC .... *H01L 23/3107* (2013.01); *H01L 23/49838* (2013.01); *H01L 23/5389* (2013.01); *H01L 24/82* (2013.01); *H01L 2224/24155* (2013.01); *H01L 2224/82986* (2013.01)

(58) Field of Classification Search
USPC .................................. 257/773; 438/618, 666
See application file for complete search history.

(56) References Cited

U.S. PATENT DOCUMENTS

| | | | |
|---|---|---|---|
| 2007/0096292 A1 | 5/2007 | Machida | |
| 2011/0075376 A1* | 3/2011 | Itoh | H05K 7/20472 361/707 |
| 2014/0211437 A1 | 7/2014 | Ueta | |
| 2015/0062848 A1 | 3/2015 | Lee et al. | |
| 2016/0338202 A1* | 11/2016 | Park | H01L 24/00 |
| 2017/0040265 A1 | 2/2017 | Park et al. | |
| 2017/0263522 A1 | 9/2017 | Kim et al. | |
| 2018/0145044 A1 | 5/2018 | Park et al. | |
| 2018/0226351 A1 | 8/2018 | Park et al. | |

FOREIGN PATENT DOCUMENTS

| | | |
|---|---|---|
| EP | 2763518 A1 | 8/2014 |
| JP | 2007-123524 A | 5/2007 |
| JP | 2011-216635 A | 10/2011 |
| JP | 2013-077691 A | 4/2013 |
| JP | 2015-050457 A | 3/2015 |
| JP | 2016-076510 A | 5/2016 |
| JP | 2016-213466 A | 12/2016 |
| KR | 10-2007-0045929 A | 5/2007 |
| KR | 10-2015-0025449 A | 3/2015 |
| KR | 10-2016-0132751 A | 11/2016 |
| KR | 10-2016-0132763 A | 11/2016 |
| KR | 10-2017-0105809 A | 9/2017 |
| TW | 200742521 A | 11/2007 |
| TW | 201709777 A | 3/2017 |
| WO | 2013/047520 A1 | 4/2013 |

OTHER PUBLICATIONS

Brunnbauer, et al., "Embedded Wafer Level all Grid Array (eWLB)", 8th Electronics Packaging Technology Conference(EPTC), Apr. 16, 2007, 05 pages.

* cited by examiner

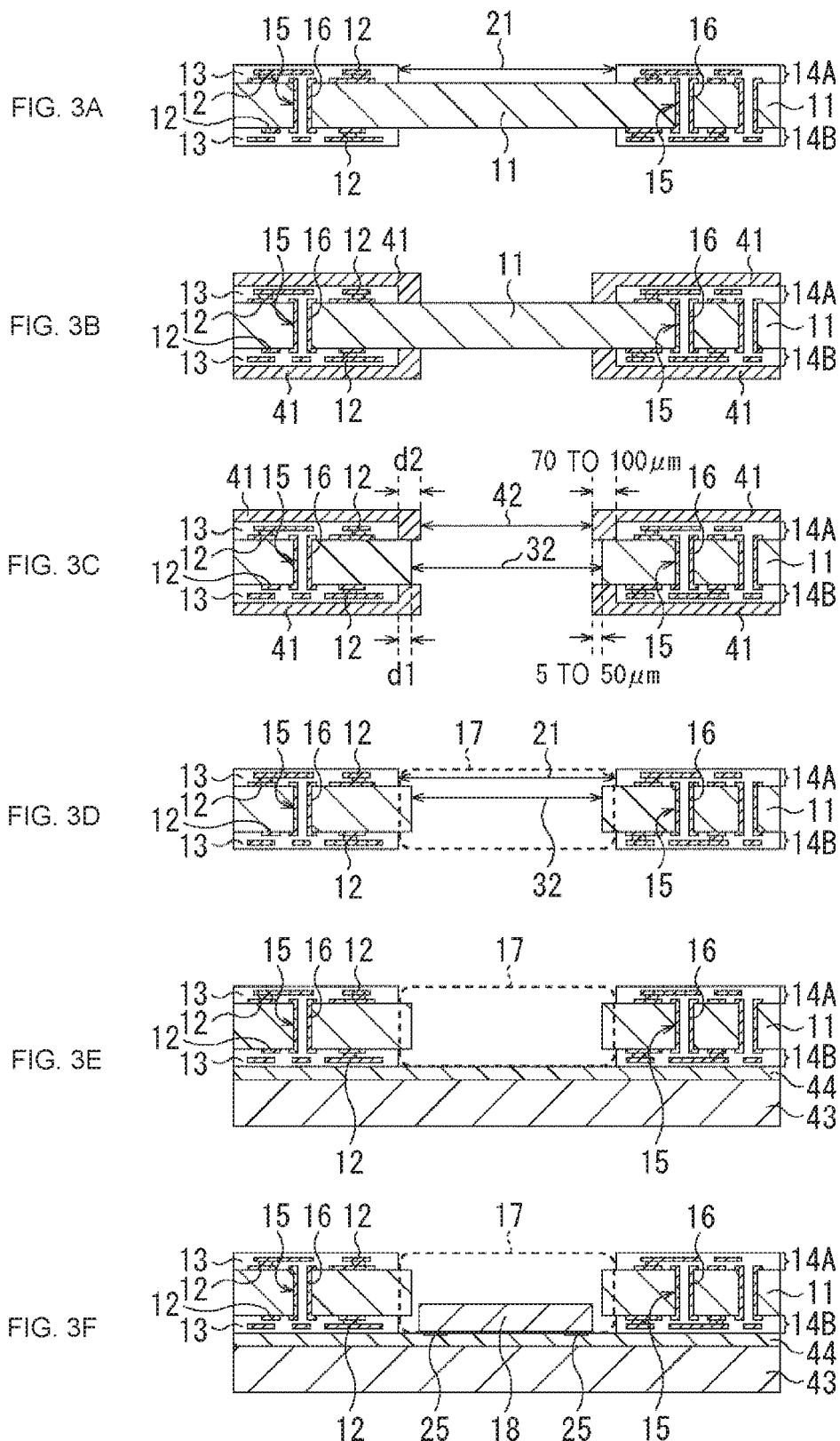

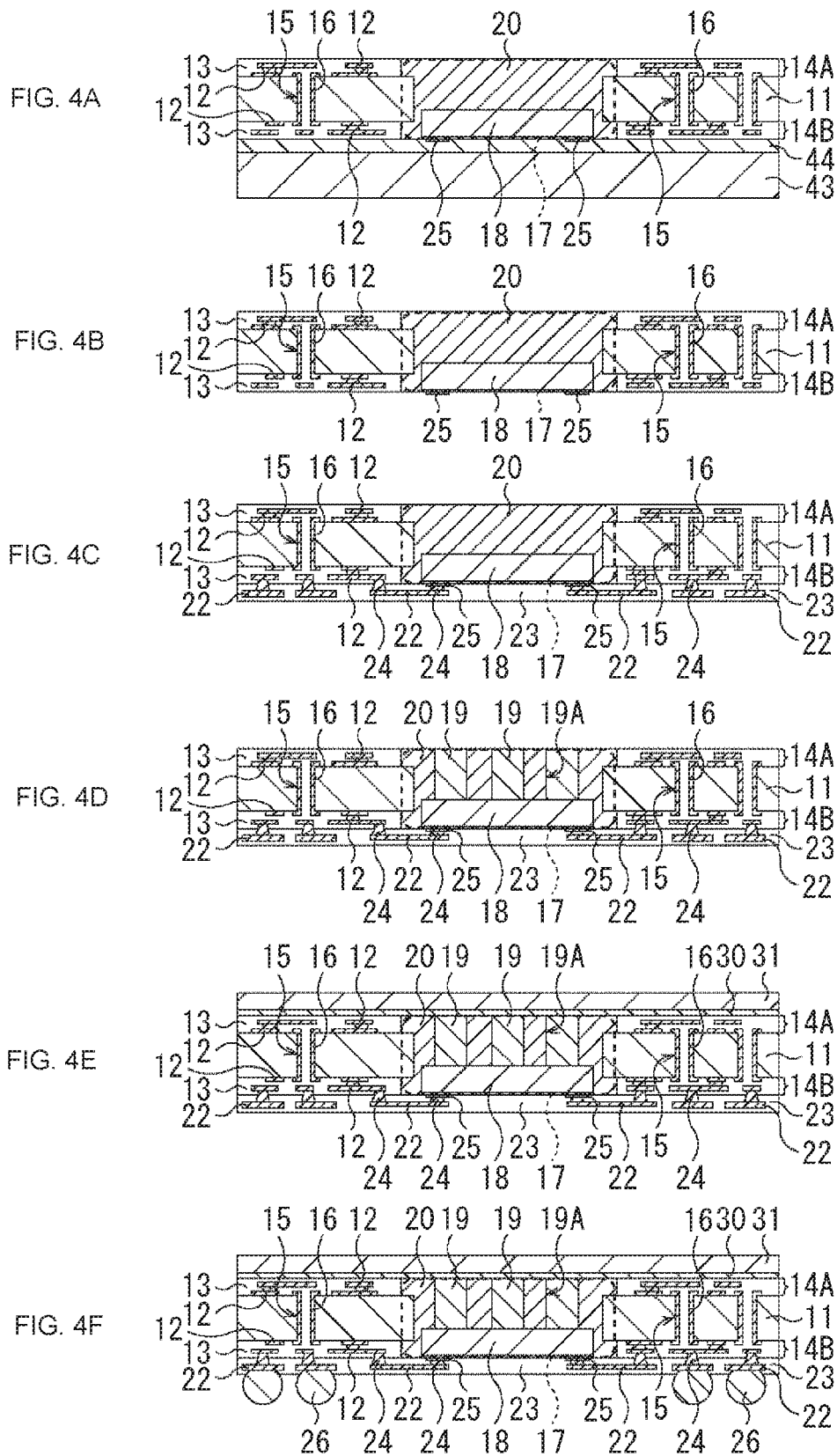

SEMICONDUCTOR DEVICE INCLUDING GLASS SUBSTRATE HAVING IMPROVED RELIABILITY AND METHOD OF MANUFACTURING THE SAME

CROSS REFERENCE TO RELATED APPLICATIONS

This application is a U.S. National Phase of International Patent Application No. PCT/JP2018/035840 filed on Sep. 27, 2018, which claims priority benefit of Japanese Patent Application No. JP 2017-197727 filed in the Japan Patent Office on Oct. 11, 2017. Each of the above-referenced applications is hereby incorporated herein by reference in its entirety.

TECHNICAL FIELD

The present technology relates to a semiconductor device and a method of manufacturing the same, and especially relates to a semiconductor device and a method of manufacturing the same capable of improving reliability of a glass substrate on which a wiring layer is formed.

BACKGROUND ART

In recent electronic devices represented by mobile devices, it is required to cope with an increase in signal frequency accompanying higher performance, higher functionality, and an increase in communication speed and capacity of an element to be used in addition to continuous demand for smaller and thinner electronic components mounted in the devices.

To meet these requirements, various mounting and packaging technologies have been developed. Among such technologies, for example, there is a fan-out wafer level package (FO-WLP) as disclosed in Non-Patent Document 1. This is a kind of so-called fan-out type package in which a redistribution layer (RDL) formed on a bare chip is extended outside a chip outline. FO-WLP realizes miniaturization by applying a thin film wiring process used in a conventional wafer process to a redistribution layer process. FO-WLP is expected to realize a multi-chip module in which a plurality of chips is connected with high-density wiring, and to achieve a significant reduction in size and thickness from conventional packages.

A method of forming FO-WLP includes a chip-first system disclosed in Non-Patent Document 1 in which a pseudo wafer in which a bare chip is embedded in mold resin is formed and a redistribution layer is formed thereon, and a so-called RDL-first system in which a bare chip is flip-chip mounted on a previously formed redistribution layer; the chip-first system is dominant. Especially, for packages that handle high-speed and high-frequency signals, the chip-first system structure with no bumps or wires in connection between the bare chip and the redistribution layer is effective for suppressing parasitic inductance and signal return loss at the connection.

However, in this chip-first system, even if the bare chip is an excellent product, if there is a defective part in the redistribution layer, the package becomes defective. As a cause of poor redistribution layer formation is warpage of the pseudo wafer formed by using the mold resin, and bare chip positional shift due to shrinkage during mold curing. Especially, in a multi-chip module in which a plurality of bare chips is connected, in addition to the positional shift in the wafer, the positional shift between the chips in a package region also occurs in a composite manner.

For such a situation, suggested is a technology so-called chip-middle system of forming at least one layer of wiring on an insulating base material that maintains rigidity of the package, thereafter opening a through hole on the insulating base material on which the wiring is formed to embed a bare chip, and forming a redistribution layer (refer to Patent Document 1).

CITATION LIST

Patent Document

Patent Document 1: Japanese Patent Application Laid-Open No. 2016-213466

Non-Patent Document

Non-Patent Document 1: M. Brunnbauer et al., "Embedded wafer level ball grid array (eWLB)", 2006, EPTC '06. 8th

SUMMARY OF THE INVENTION

Problems to be Solved by the Invention

Patent Document 1 discloses thermosetting resin, thermoplastic resin, glass, ceramic, plastic and the like as examples of the insulating base materials that maintain rigidity of the package; however, in a case where glass is used as the insulating base material, damage was likely to occur when opening the through hole in glass which is a brittle material.

The present technology is achieved in view of such a situation, and an object thereof is to improve reliability of a glass substrate on which a wiring layer is formed.

Solutions to Problems

A semiconductor device according to a first aspect of the present technology is provided with a glass substrate on a front surface or front and back surfaces of which a wiring layer including one or more layers of wiring is formed, an electronic component arranged inside an opening formed on the glass substrate, and a redistribution layer that connects the wiring of the glass substrate and the electronic component.

In the first aspect of the present technology, a glass substrate on a front surface or front and back surfaces of which a wiring layer including one or more layers of wiring is formed, an electronic component arranged inside an opening formed on the glass substrate, and a redistribution layer that connects the wiring of the glass substrate and the electronic component are provided.

A method of manufacturing a semiconductor device according to a second aspect of the present technology is provided with forming a wiring layer including one or more layers of wiring on a front surface or front and back surfaces of a glass substrate, forming an opening on the glass substrate and arranging an electronic component inside the opening, and forming a redistribution layer that connects the wiring of the glass substrate to the electronic component.

In the second aspect of the present technology, a wiring layer including one or more layers of wiring is formed on a front surface or front and back surfaces of a glass substrate, an opening is formed on the glass substrate and an electronic component is arranged inside the opening, and a redistribution layer that connects the wiring of the glass substrate to the electronic component is formed.

The semiconductor device may be an independent device or may be a module incorporated in another device.

Effects of the Invention

According to the first and second aspects of the present technology, the reliability of the glass substrate on which the wiring layer is formed may be improved.

Note that, the effects are not necessarily limited to the effects herein described and may be the effects described in the present disclosure.

BRIEF DESCRIPTION OF DRAWINGS

FIGS. 3A, 3B, 3C, 3D, 3E, and 3F are views explaining a method of manufacturing the semiconductor device in FIG. 1.

FIGS. 4A, 4B, 4C, 4D, 4E, and 4F are views explaining a method of manufacturing the semiconductor device in FIG. 1.

MODE FOR CARRYING OUT THE INVENTION

A mode for carrying out the present technology (hereinafter, referred to as an embodiment) is hereinafter described. Note that, the description is given in the following order.

1. First Embodiment of Semiconductor Device
1.1 Cross-sectional View of Semiconductor Device
1.2 Method of Manufacturing Semiconductor Device
2. Variation of First Embodiment
2.1 First Variation
2.2 Second Variation
3. Second Embodiment of Semiconductor Device
4. Third Embodiment of Semiconductor Device
5. Fourth Embodiment of Semiconductor Device
6. Fifth and Sixth Embodiments of Semiconductor Device
7. Application Example 1. First Embodiment of Semiconductor Device <1.1 Cross-Sectional View of Semiconductor Device>

Figure 1:
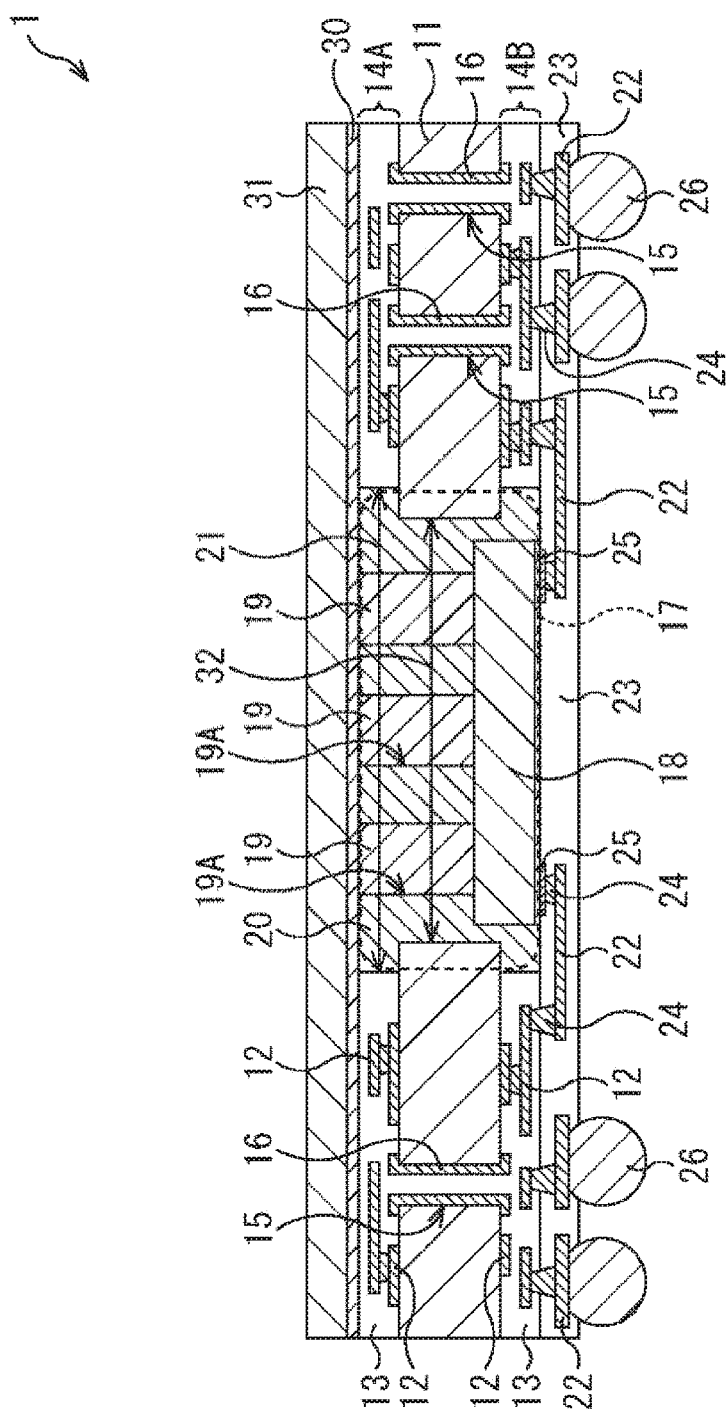
FIG. 1 is a cross-sectional view illustrating a configuration example of a first embodiment of a semiconductor device to which the present technology is applied.

FIG. 1 is a cross-sectional view illustrating a configuration example of a first embodiment of a semiconductor device to which the present technology is applied.

A semiconductor device 1 in FIG. 1 includes wiring layers 14A and 14B each including one or more layers of wiring 12 and an insulating layer (interlayer insulating film) 13 on an upper surface and a lower surface of a glass substrate 11 serving as a core substrate, respectively. In FIG. 1, the lower surface of the glass substrate 11 is a front surface of the glass substrate 11 and the upper surface of the glass substrate 11 is a back surface of the glass substrate 11. One or more through holes 15 are formed in a predetermined region of the glass substrate 11, and a through via (through electrode) 16 formed on an inner periphery of the through hole 15 electrically connects the wiring 12 of the wiring layer 14A on the upper surface and the wiring 12 of the wiring layer 14B on the lower surface. Hereinafter, the wiring layers 14A and 14B are also referred to as the wiring layers 14 in a case where they are not especially distinguished from each other.

Furthermore, the semiconductor device 1 is provided with a cavity 17 obtained by opening the glass substrate 11 and the wiring layers 14A and 14B in the substantially central portion in a plane direction in the device. An electronic component 18 is arranged in the cavity 17, and a space other than the electronic component 18 in the cavity 17 is filled with a heat radiating conducting material 19 and resin 20. More specifically, a plurality of through holes 19A penetrating the resin 20 filled above the electronic component 18 in a depth direction is formed, and the heat radiating conducting material 19 is embedded in each through hole 19A. The electronic component 18 is a component such as an antenna, a filter, a power amplifier, a switch, a low-noise amplifier, a phase shifter, a mixer, a PLL, and a passive element, for example.

A heat sink (heat spreader) 31 is adhered to an upper surface of the wiring layer 14A being an upper side of the semiconductor device 1 with a thermal conductive adhesive 30 such as a thermal interface material (TIM). Therefore, heat released above the electronic component 18 by the heat radiating conducting material 19 may be diffused to be radiated.

In contrast, a redistribution layer 22 and an insulating layer 23 are formed on a lower surface of the wiring layer 14B being a lower side of the semiconductor device 1, and the redistribution layer 22 is connected to a terminal 25 of the electronic component 18 through a via 24, or connected to the wiring 12 of the wiring layer 14B. The redistribution layer 22 electrically connects the terminal 25 of the electronic component 18 to the wiring 12 of the wiring layer 14B. A signal and a power supply voltage supplied to the electronic component 18 are input from an external terminal 26 to the electronic component 18 through the redistribution layer 22, and an output signal of the electronic component 18 is output from the external terminal 26 through the redistribution layer 22. The external terminal 26 is, for example, a solder bump, and Ni/Au or Ni/Pd/Au plating (not illustrated) as under bump metal (UBM) is formed on a surface of the redistribution layer 22 on which the external terminal 26 is arranged.

Note that, the semiconductor device 1 may be formed without the external terminal 26. In this case, for example, when the semiconductor device 1 is mounted on a main substrate, the redistribution layer 22 of the semiconductor device 1 and the main substrate are connected to each other by the solder bump and the like.

In the semiconductor device 1 configured in the above-described manner, the heat radiating conducting material 19 is arranged so as to be in contact with an upper surface of the electronic component 18 arranged in the cavity 17, and the heat radiating conducting material 19 is connected to the heat sink 31 by means of the thermal conductive adhesive 30.

By forming a heat radiating path of the electronic component 18 by arranging the heat radiating conducting material 19 using a high thermal conductivity material so as to be in contact with the upper surface of the electronic component 18 instead of passing through the glass substrate 11 with low thermal conductivity, heat radiation efficiency may be improved. Furthermore, by arranging the heat sink 31 on an upper surface of the semiconductor device 1 and connecting the same to the heat radiating conducting material 19 through the thermal conductive adhesive 30, a heat radiating structure by means of a higher capacity may be realized.

Furthermore, in the semiconductor device 1, in the cavity 17, an opening width of a wiring layer non-formed region 21 which is a region in which the upper and lower wiring layers 14 of the glass substrate 11 are not formed is made wider than a width of a glass opening 32 that is the opening of the glass substrate 11.

In the semiconductor device 1, the electronic component 18, the resin 20, and the wiring layer 14B having different thermal expansion coefficients are formed on the insulating layer 23 including the redistribution layer 22 in regions separated in a plane direction.

Figure 2A:
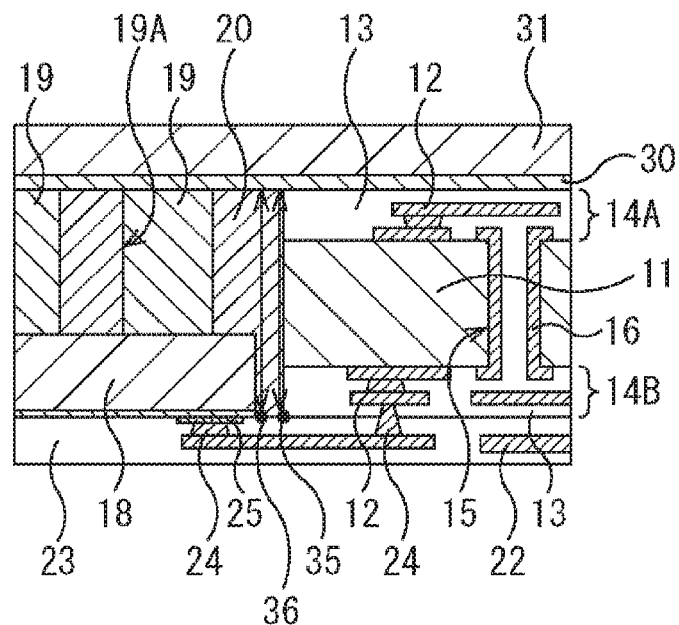
FIGS. 2A and 2B are views explaining an advantage of the semiconductor device in FIG. 1.

In a case where end faces of the wiring layers 14A and 14B and an end face of the glass substrate 11 are flush with one another as illustrated in FIG. 2A, a stress load corresponding to a thickness of the resin 20 is applied to a boundary 35 between the resin 20 and the wiring layer 14B and a boundary 36 between the resin 20 and the electronic component 18 being singular points of stress due to expansion and contraction due to a thermal cycle and the like, causing deterioration in reliability of the redistribution layer 22 formed so as to straddle the electronic component 18, the resin 20, and the wiring layer 14B.

Figure 2B:
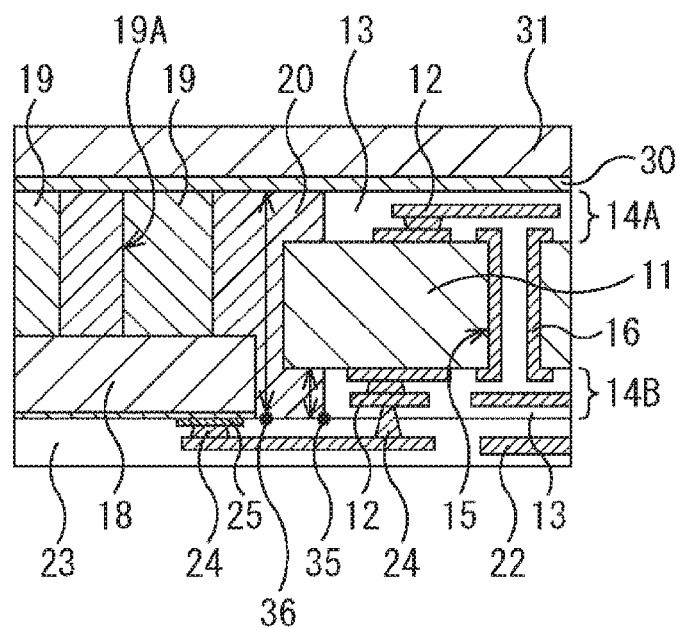

In contrast, in the semiconductor device 1, as illustrated in FIG. 2B, the end face of the glass substrate 11 is offset with respect to the end faces of the wiring layers 14A and 14B, and the stress applied to the boundary 35 between the resin 20 and the wiring layer 14B is the stress corresponding to the thickness of the wiring layer 14A or 14B, so that the stress load is reduced as compared with a case in FIG. 2A. Therefore, the reliability of the redistribution layer 22 formed over an entire lower surface may be improved.

<1.2 Method of Manufacturing Semiconductor Device>

Next, a method of manufacturing the semiconductor device 1 illustrated in FIG. 1 is described with reference to FIGS. 3A, 3B, 3C, 3D, 3E, 3F, 4A, 4B, 4C, 4D, 4E, and 4F.

First, as illustrated in FIG. 3A, the wiring layers 14A and 14B are formed on the upper and lower surfaces of the glass substrate 11, respectively. The wiring layers 14A and 14B are formed with the wiring layer non-formed region 21 having the opening width wider than the width of the glass opening 32 (FIG. 1) secured. In the following description, the glass substrate 11 on which the wiring layers 14A and 14B are formed is also collectively referred to as a glass wiring substrate.

A material of the glass substrate 11 is desirably non-alkali glass that does not contain alkali metal or low-alkali glass from the viewpoint of matching of a linear expansion coefficient with the electronic component 18 embedded therein and wiring reliability. For example, as the material of the glass substrate 11, AN100 (Asahi Glass Co., Ltd.), Eagle-XG (Corning Incorporated), OA-10G (Nippon Electric Glass Co., Ltd.) and the like may be used.

The wiring 12 in the wiring layers 14A and 14B may be formed by a semi-additive method using Cu as a metal material, for example, but the material of the wiring 12 and the method of forming the same are not limited to them. This is similar for a material of the insulating layer 13; in a case where the wiring layer non-formed region 21 is formed and multilayer wiring 12 is required, it is more preferable to use a thin-film photo imageable dielectric (PID) material as the material of the insulating layer 13 from the viewpoint of suppressing a step between a forming region of the wiring 12 and the wiring layer non-formed region 21 and suppressing residue in the wiring layer non-formed region 21.

Next, resist 41 is formed so as to cover the wiring layers 14A and 14B formed on the upper and lower surfaces of the glass substrate 11, respectively, as illustrated in FIG. 3B, and thereafter, the glass substrate 11 in a region in which the resist 41 is not formed is removed. Therefore, as illustrated in FIG. 3C, the glass substrate 11 is opened. The resist 41 formed on the upper surfaces of the wiring layers 14A and 14B is, for example, HF resistant resist and the like supporting isotropic wet etching of HF and the like.

A process of opening the glass substrate 11 is not especially limited as long as this is a method capable of processing a glass material at a practical speed such as laser ablation, stealth dicing, sand blasting, wet etching and the like. For example, it is possible to adopt a method of processing in two stages of rough first processing and fine second processing such as a method of opening by the laser ablation processing and thereafter removing microcracks and a residual stress layer on the processed end faces by the isotropic wet etching of HF and the like. In this case, although it depends on the processing method, in the rough first processing, a damage layer is formed to a depth of about 5 to 50 um from the end face of the glass substrate 11, so that an offset amount from the end faces of the wiring layers 14A and 14B to the end face of the glass substrate 11 before the second processing is set to be larger than a width of the damage layer, for example, about 70 to 100 um. Note that, the glass substrate 11 may be opened by only one processing method such as only the isotropic wet etching without performing processing in two stages. The glass opening 32 of the glass substrate 11 is formed to be wider than a non-formed region 42 of the resist 41 by the isotropic wet etching. As a result, a distance d1 in the planar direction from the end face of the glass opening 32 to the end face of the wiring layer 14 is shorter than a distance d2 in the planar direction from the end face of the resist 41 to the end face of the wiring layer 14.

After the glass opening 32 is formed on the glass substrate 11, as illustrated in FIG. 3D, the resist 41 formed on the upper surfaces of the wiring layers 14A and 14B is removed. Therefore, the cavity 17 in which there is the offset between the wiring layer non-formed region 21 and the glass opening 32 is formed.

Subsequently, as illustrated in FIG. 3E, a support substrate 43 is temporarily bonded to a lower surface of the wiring layer 14B using a temporary-bonding (TB) material 44. As the TB material 44, a material generally used in a chip-first system FO-WLP is used. Examples of the TB material 44 include a thermal peeling type, an ultraviolet peeling type, and a chemical solution dissolving type and the like, for example. Furthermore, it is desirable to use the support substrate 43 having a thermal expansion coefficient the same as or close to that of the material used for the glass wiring substrate from the viewpoint of suppressing substrate warpage after bonding. Note that, in a case where an opening area ratio of the glass opening 32 to the glass wiring substrate is high, rigidity is deteriorated in the glass wiring substrate after forming the glass opening 32 and this is easily broken. Therefore, the support substrate 43 may be first bonded to the glass wiring substrate, and then the glass opening 32 may be formed. That is, a timing of forming the glass opening 32 may be before or after bonding the support substrate 43.

Next, as illustrated in FIG. 3F, the electronic component 18 is face-down mounted on the TB material 44 in the cavity 17. When mounting, a chip mounter, a flip-chip bonder and the like may be used depending on the type of the electronic component 18, and in order to improve alignment accuracy, it is possible to secure mounting accuracy based on an alignment mark formed on the glass wiring substrate and arrange the electronic component 18.

Next, as illustrated in FIG. 4A, a region other than the electronic component 18 of the cavity 17 formed on the glass wiring substrate is filled with the resin 20. A method of filling the resin 20 is appropriately selected depending on a form and a characteristic of the filling material. For example, vacuum laminating is selected for a film-shaped PID material (polyimide, PBO and the like) and ajinomoto build-up film (ABF), vacuum screen printing is selected for high-viscosity resin, compression molding is selected for mold compound and the like. Note that, in a case where the filled resin 20 remains on a back surface side of the glass wiring substrate by application or laminating, this may be left as it is as a wiring insulating layer, or may be removed and flattened by polishing, a surface planer and the like.

Next, as illustrated in FIG. 4B, the support substrate 43 is peeled by using a peeling method according to the type of the used TB material 44. At that time, in a case where there is the residue on the terminal 25 of the electronic component 18 or a connection pad surface of the wiring 12 on the lower surface of the glass substrate 11 that is a peeling surface, desmear processing such as plasma cleaning may be performed as necessary.

Next, as illustrated in FIG. 4C, the redistribution layer 22 and the insulating layer 23 are formed on the wiring layer 14B side of the glass wiring substrate. The wiring 12 in the wiring layer 14B is electrically connected to the redistribution layer 22 at a predetermined location through the via 24. Although the redistribution layer 22 may be formed directly on the insulating layer 13 of the wiring layer 14B, it is preferable to form the redistribution layer 22 after forming the insulating layer 23 as in this embodiment. This is because the insulating layer 23 brings an effect as a step absorbing layer when the redistribution layer 22 straddles the electronic component 18, the resin 20, and the glass wiring substrate, as a stress buffer layer at a connection with the electronic component 18, and further as suppression of ion migration along a buried interface of the electronic component 18.

Next, as illustrated in FIG. 4D, the through hole 19A is formed on the upper surface of the electronic component 18 in the cavity 17 filled with the resin 20, and the heat radiating conducting material 19 is embedded therein.

As a method of forming the through hole 19A in which the heat radiating conducting material 19 is embedded, an optimum method is selected according to the material of the resin 20. For example, if the material of the resin 20 is the PID material, it is possible to remove material of the resin 20 by exposure and development to form the through hole 19A.

Figure 5A:
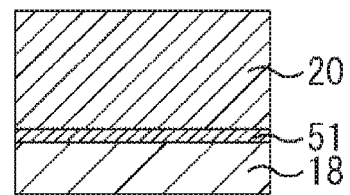
FIGS. 5A, 5B, 5C, and 5D are views explaining a method of forming a heat radiating conducting material.
Figure 5B:
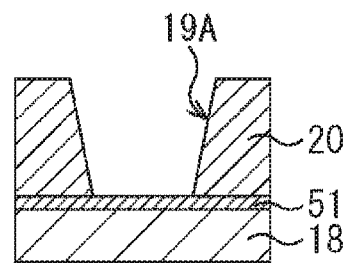
Figure 5C:
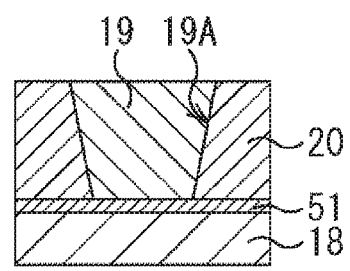
Figure 5D:
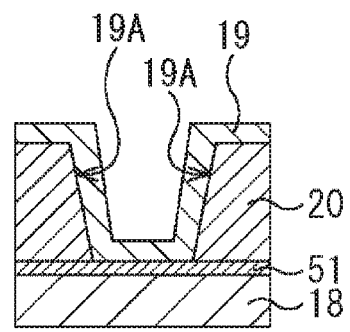

Furthermore, for example, if the material of the resin 20 is mold resin and the like, as illustrated in FIG. 5A, a metal layer 51 may be formed in advance on the upper surface of the electronic component 18, and while using this as a stopper, as illustrated in FIG. 5B, the through hole 19A may be opened with a CO2 laser and the like as when forming a through mold via (TMV), and the heat radiating conducting material 19 may be embedded therein as illustrated in FIG. 5C. The heat radiating conducting material 19 may be Cu plating, conductive paste and the like, but a metal material having high thermal conductivity such as Cu is more preferable. The heat radiating conducting material 19 may be embedded in the entire interior of the through hole 19A as illustrated in FIG. 5C, but it is also possible that the entire interior of the through hole 19A is not filled with the heat radiating conducting material 19 and an inner peripheral surface of the through hole 19A and an upper surface of the metal layer 51 are embedded as illustrated in FIG. 5D. Furthermore, a planar shape of the through hole 19A may be circular or polygonal.

Next, as illustrated in FIG. 4E, the heat sink 31 is adhered to the upper surface of the wiring layer 14A with the thermal conductive adhesive 30 such as TIM. For the heat sink 31, for example, a conductive material having high thermal conductivity in the plane direction such as copper foil or a graphite sheet is used.

Finally, as illustrated in FIG. 4F, the external terminal 26 such as the solder bump is formed on the lower surface of the wiring layer 14B on the lower side of the semiconductor device 1.

As described above, the semiconductor device 1 in FIG. 1 is completed.

In FIGS. 3A, 3B, 3C, 3D, 3E, 3F, 4A, 4B, 4C, 4D, 4E, and 4F a portion corresponding to one semiconductor device 1 illustrated in FIG. 1 is illustrated, but it is possible to manufacture a large number of semiconductor devices 1 simultaneously from one glass substrate 11 by using a large-sized glass substrate as that used in manufacturing a liquid display panel as the glass substrate 11. Furthermore, the size of the glass substrate 11 may be a wafer size.

The glass substrate 11 of the semiconductor device 1 serves as a stiffening plate (stiffener) and may suppress warpage of a panel at the time of manufacture and positional shift of the electronic component 18 as well as warpage of the semiconductor device 1 itself as a package.

In a so-called RDL-first system FO-WLP structure in which a bare chip (electronic component 18) is flip-chip mounted on the redistribution layer previously formed, the heat radiating path from the chip that is flip-chip connected to the glass wiring substrate is either an escape from a chip back surface side, or an escape to a glass substrate back surface through the flip-chip connection and the glass through electrode.

In the system of allowing the heat to escape from the chip back surface side, the heat sink is arranged in the vicinity of the redistribution layer, and since most of the heat sink is made using a conductive material, this causes impedance shift of the redistribution layer, which is especially fatal for a high-frequency circuit.

In contrast, in the system of allowing the heat to escape to the glass substrate back surface through the flip-chip connection and the glass through electrode, when it is tried to lower thermal resistance of the glass through electrode, a diameter of the glass through hole increases, which is disadvantageous for miniaturization, and if the diameter remains small, the thermal resistance becomes high. Furthermore, there is no practical glass processing technique to simultaneously open through holes having different diameters.

According to the structure of the semiconductor device 1 in FIG. 1, the through via 16 as fine wiring is formed in the glass wiring substrate, and the through hole for heat radiation is formed in the resin 20 that is more easily processed than the glass substrate 11, so that the through holes of optimal sizes may be formed.

2. Variation of First Embodiment

<2.1 First Variation>

Figure 6:
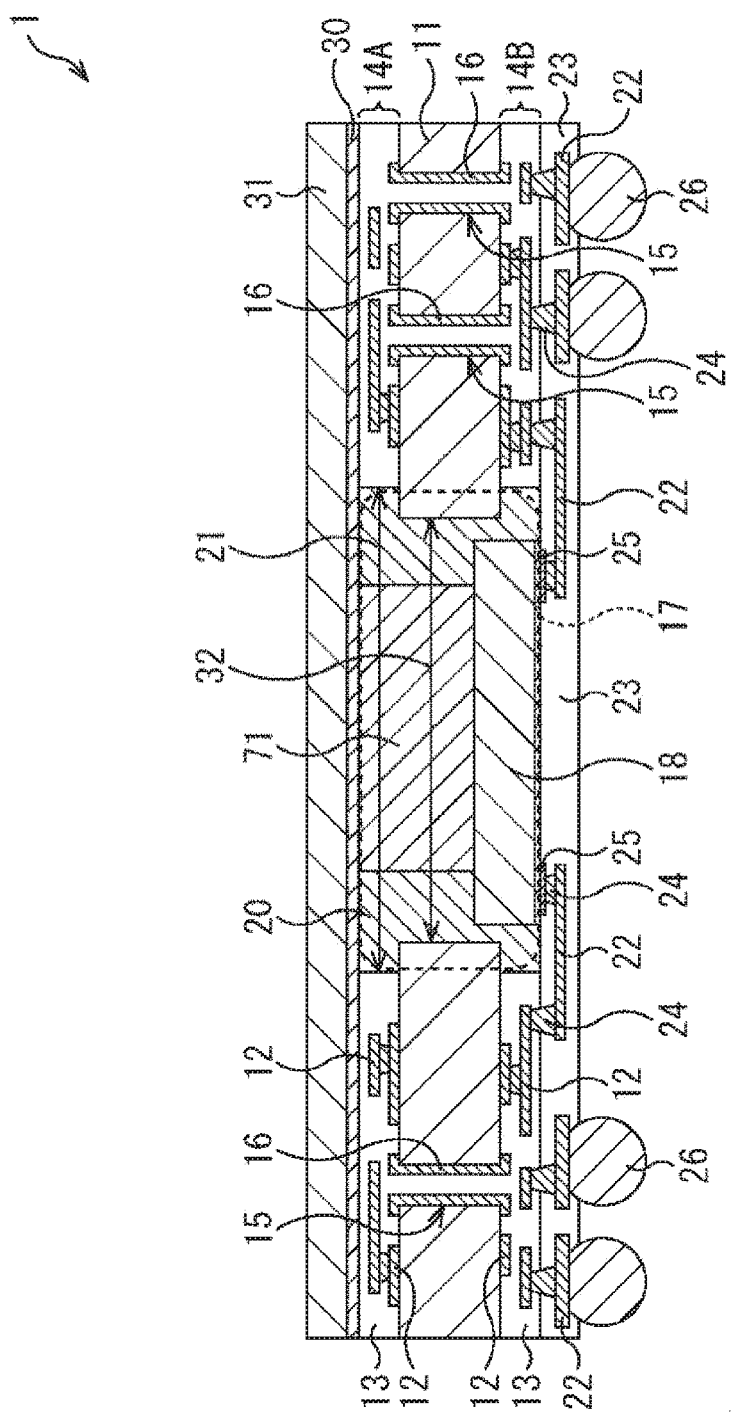
FIG. 6 is a cross-sectional view illustrating a first variation of the first embodiment.

FIG. 6 is a cross-sectional view illustrating a first variation of the first embodiment.

In the variation and other embodiments illustrated in FIG. 6 and subsequent drawings, the same reference signs are assigned to the portions corresponding to those in the first embodiment illustrated in FIG. 1, and the descriptions of the portions are omitted as appropriate.

In the first embodiment illustrated in FIG. 1, a plurality of through holes 19A is formed in the resin 20 above the electronic component 18, and the heat radiating conducting material 19 is embedded in each through hole 19A.

In contrast, in the first variation in FIG. 6, a heat radiating conducting material 71 having a block (cuboid) shape is embedded in resin 20 above an electronic component 18. The heat radiating conducting material 71 may be Cu plating, conductive paste and the like as is the case with the heat radiating conducting material 19, but a metal material having high thermal conductivity such as Cu is preferable. In this manner, a structure of a heat radiating path formed by using the heat radiating conducting material above the electronic component 18 is not limited to the through hole.

Note that, in a case of the block-shaped heat radiating conducting material 71 as illustrated in FIG. 6, the electronic component 18 to an upper surface (back surface) of which the block-shaped heat radiating conducting material 71 is adhered is only required to be mounted on a TB material 44 at a step of mounting the electronic component 18 illustrated in FIG. 3F. A height of the block-shaped heat radiating conducting material 71 is set such that the total height of the block-shaped heat radiating conducting material 71 and the electronic component 18 is the same as the total height of a glass substrate 11 and wiring layers 14A and 14B, and a space around the heat radiating conducting material 71 is filled with the resin 20 so as to be flush with an upper surface of the block-shaped heat radiating conducting material 71.

<2.2 Second Variation>

Figure 7:
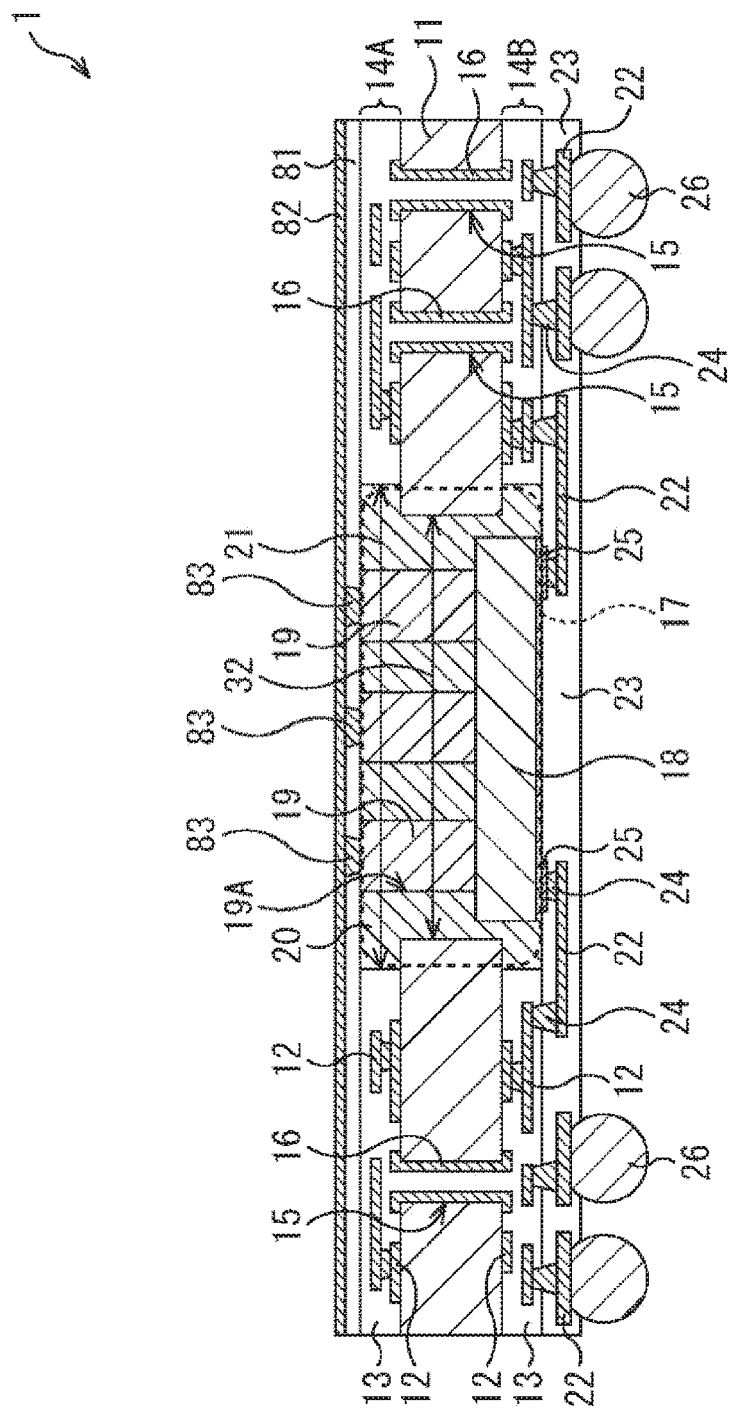
FIG. 7 is a cross-sectional view illustrating a second variation of the first embodiment.

FIG. 7 is a cross-sectional view illustrating a second variation of the first embodiment.

The second variation in FIG. 7 illustrates a configuration example in a case where a plurality of heat radiating conducting materials 19 formed above an electronic component 18 also serves as ground terminals.

Specifically, a redistribution layer 82 is formed on upper surfaces of the heat radiating conducting material 19 and resin 20 of a cavity 17 and a wiring layer 14A through an insulating layer 81, and the redistribution layer 82 is electrically connected to each of the plurality of heat radiating conducting materials 19 through vias 83. The redistribution layer 82 is formed using a metal material such as Cu, Al, or W, for example.

In this manner, it is possible to form the redistribution layer 82 connected to the plurality of heat radiating conducting materials 19 on an upper surface of a semiconductor device 1 as the heat sink 31 in FIG. 1, thereby allowing the redistribution layer 82 to serve as the heat sink 31 in FIG. 1 and the ground terminal.

3. Second Embodiment of Semiconductor Device

Figure 8:
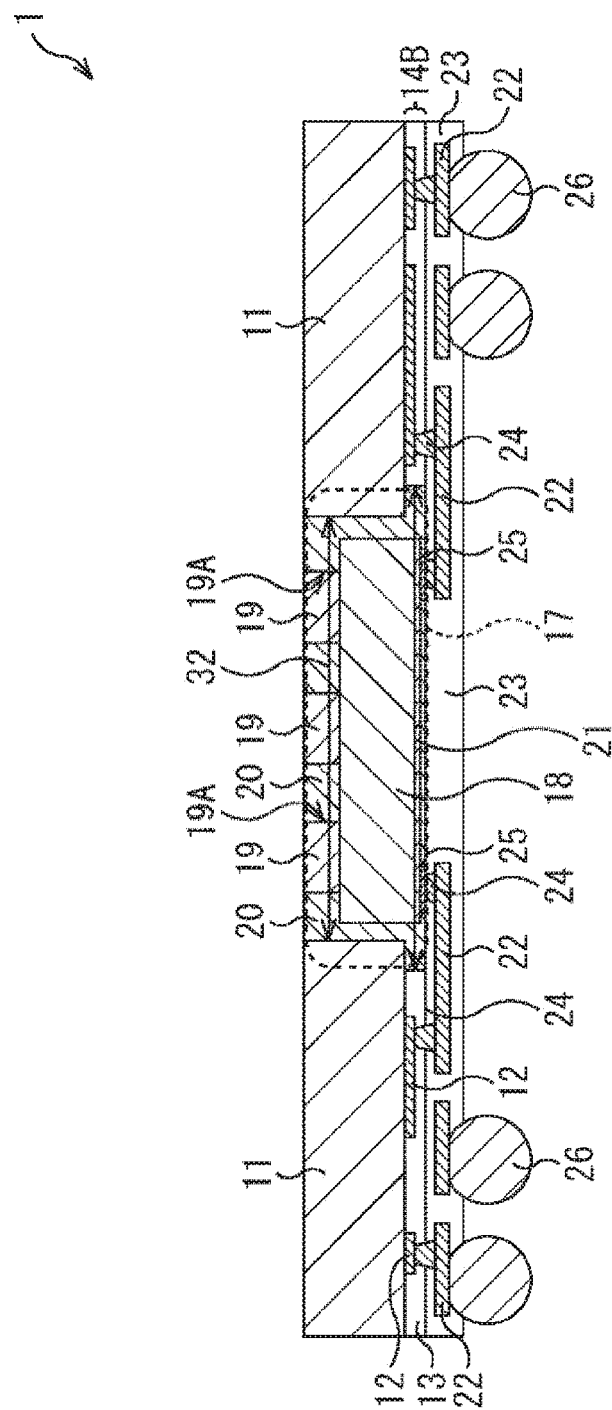
FIG. 8 is a cross-sectional view illustrating a configuration example of a second embodiment of a semiconductor device to which the present technology is applied.

FIG. 8 is a cross-sectional view illustrating a configuration example of a second embodiment of a semiconductor device to which the present technology is applied.

A semiconductor device 1 according to the second embodiment in FIG. 8 is different from the semiconductor device 1 according to the first embodiment illustrated in FIG. 1 in that a heat sink 31 connected to a wiring layer 14A with a thermal conductive adhesive 30 on an upper surface of the glass substrate 11 is omitted. In the first embodiment in FIG. 1, the heat radiating conducting material 19 and the resin 20 are filled up to a height to reach the wiring layer 14A formed on the upper surface of the glass substrate 11, but in the second embodiment in FIG. 8, they are filled up to a height to reach the upper surface (back surface) of the glass substrate 11. Other configurations of the second embodiment are similar to those of the first embodiment.

In this manner, a wiring layer 14 formed in the semiconductor device 1 may be formed only on any one of the upper surface or the lower surface of the glass substrate 11. In a case where the wiring layer 14 is formed only on any one of the upper surface or the lower surface of the glass substrate 11, as illustrated in FIG. 8, the wiring layer 14 is formed on a front surface side of the glass substrate 11 on which a terminal 25 that is a signal input/output unit of an electronic component 18 and an external terminal 26 that is a signal input/output unit of the semiconductor device 1 are formed.

In the example in FIG. 8, the heat sink 31 as well as the wiring layer 14A on the upper surface of the glass substrate 11 is omitted; however, the heat sink 31 may be added in a manner adhered to the upper surface of the glass substrate 11 with an adhesive 30.

In the second embodiment also, in a cavity 17, an opening width of a wiring layer non-formed region 21 in which a wiring layer 14B on the lower surface of the glass substrate 11 is not formed is made wider than a width of a glass opening 32 of the glass substrate 11. Therefore, as described with reference to FIGS. 2A and 2B, reliability of a redistribution layer 22 formed on an entire lower surface may be improved.

Furthermore, a plurality of through holes 19A is formed in a part of the resin 20 covering the electronic component 18, and a heat radiating conducting material 19 using a high thermal conductivity material is arranged from the upper surface of the electronic component 18 to the uppermost surface of the resin 20, so that heat radiation efficiency may be improved.

4. Third Embodiment of Semiconductor Device

Figure 9:
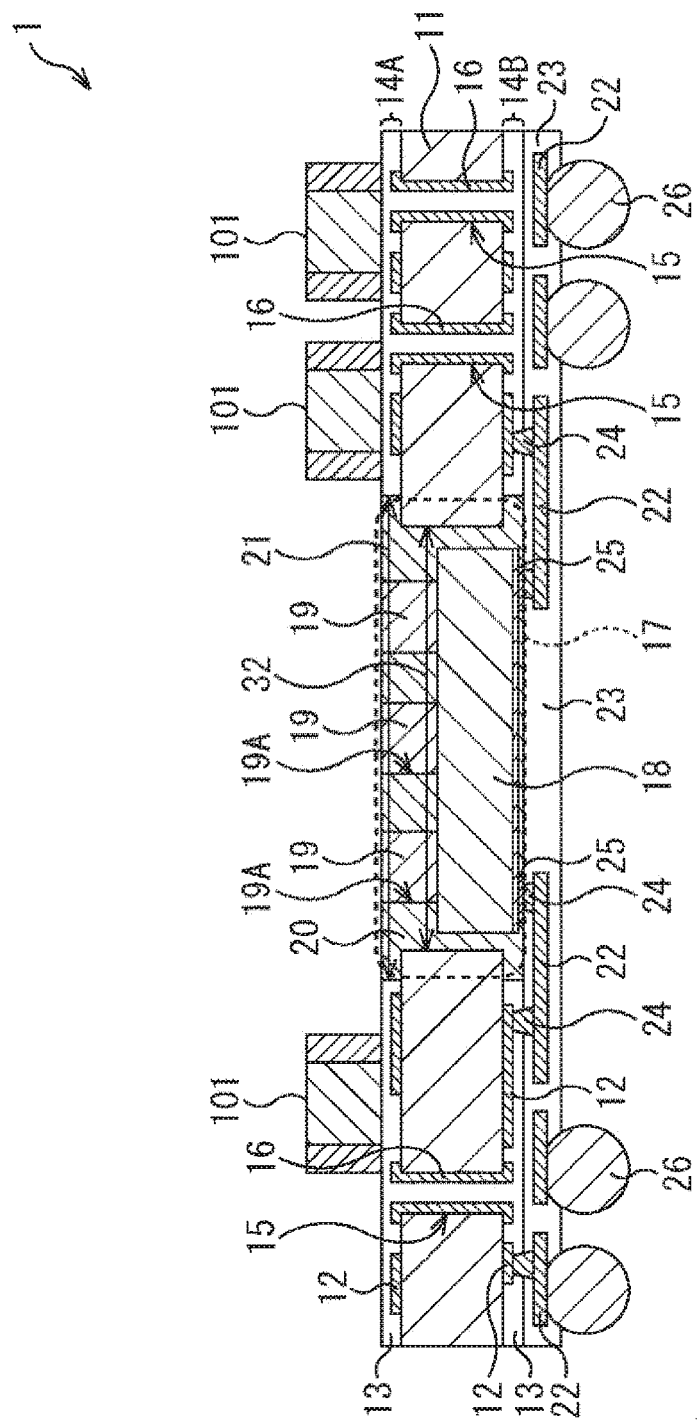
FIG. 9 is a cross-sectional view illustrating a configuration example of a third embodiment of a semiconductor device to which the present technology is applied.

FIG. 9 is a cross-sectional view illustrating a configuration example of a third embodiment of a semiconductor device to which the present technology is applied.

When a semiconductor device 1 according to the third embodiment in FIG. 9 is compared with that of the first embodiment in FIG. 1, the heat sink 31 arranged on the upper surface of the glass substrate 11 in the first embodiment is omitted. Then, in place of the heat sink 31, a discrete component 101 such as a chip capacitor is mounted. The discrete component 101 is electrically connected to wiring 12 of a wiring layer 14A at a predetermined location not illustrated. Other configurations of the second embodiment are similar to those of the first embodiment.

Although it is possible to incorporate an integrated passive device (IPD) such as a resistor or inductor into a glass wiring substrate using a wiring layer 14A formed on the upper surface of the glass substrate 11, as for an element with which it is not sufficient or a footprint becomes too large, it is possible to reduce the footprint of a package by vertically stacking the discrete components 101 on the wiring layer 14A as in the third embodiment.

In the third embodiment also, in a cavity 17, an opening width of a wiring layer non-formed region 21 in which the wiring layer 14 is not formed for the glass substrate 11 is made wider than a width of a glass opening 32 of the glass substrate 11. Therefore, as described with reference to FIGS. 2A and 2B, reliability of a redistribution layer 22 formed on an entire lower surface may be improved.

Furthermore, a plurality of through holes 19A is formed in a part of the resin 20 covering the electronic component 18, and a heat radiating conducting material 19 using a high thermal conductivity material is arranged from the upper surface of the electronic component 18 to the uppermost surface of the resin 20, so that heat radiation efficiency may be improved.

5. Fourth Embodiment of Semiconductor Device

Figure 10:
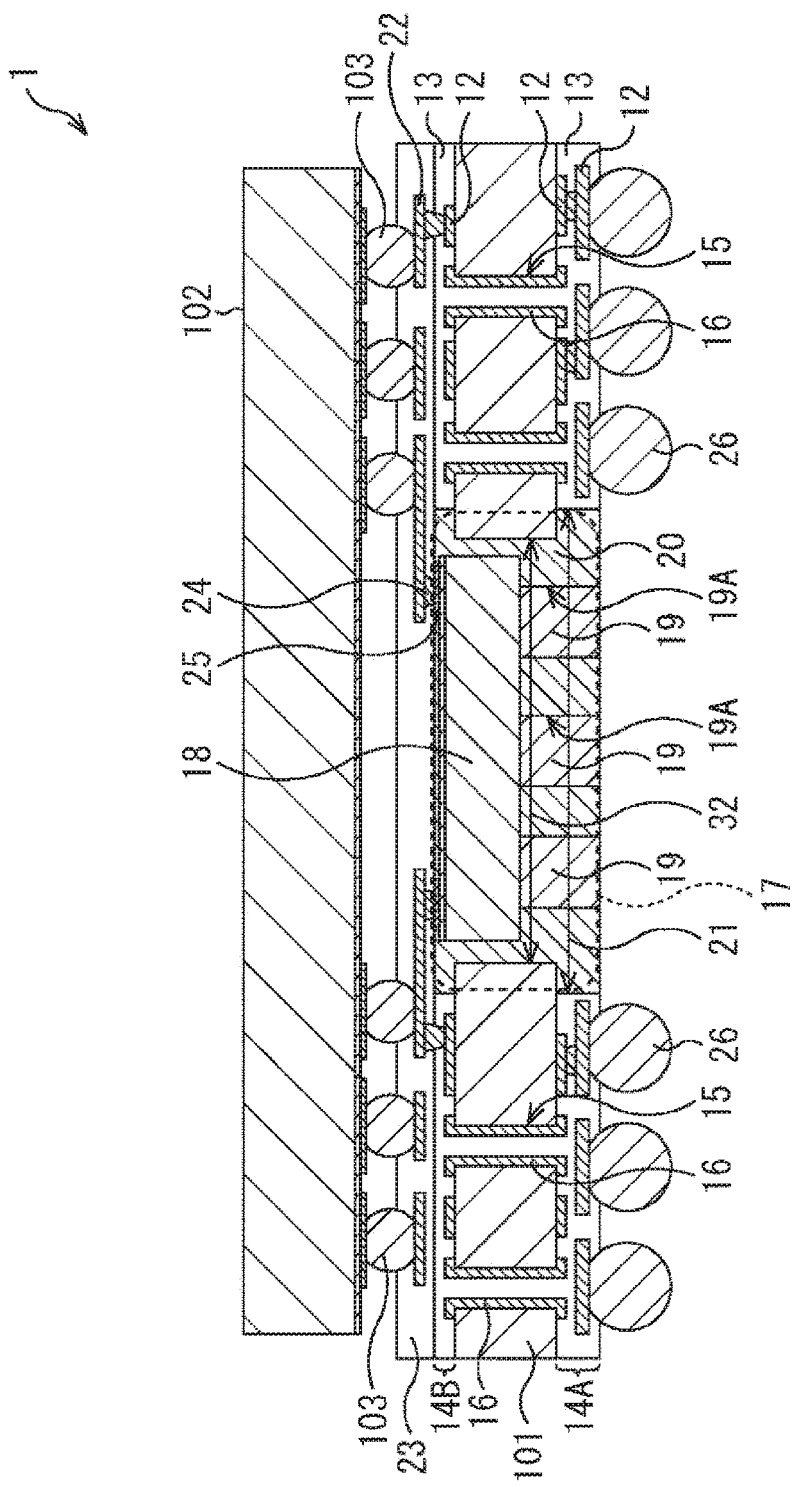
FIG. 10 is a cross-sectional view illustrating a configuration example of a fourth embodiment of a semiconductor device to which the present technology is applied.

FIG. 10 is a cross-sectional view illustrating a configuration example of a fourth embodiment of a semiconductor device to which the present technology is applied.

A semiconductor device 1 according to the fourth embodiment in FIG. 10 has a configuration in which the discrete component 101 in the third embodiment in FIG. 9 is replaced with a semiconductor element 102, and has a so-called package on package (PoP) structure. Furthermore, in the semiconductor device 1 in FIG. 10, a glass wiring substrate is turned upside down as compared with the semiconductor device 1 in FIG. 9, and a heat radiating path by a heat radiating conducting material 19 is directed downward. An external terminal 26 is connected to wiring 12 of a wiring layer 14A, and the semiconductor element 102 is connected to a redistribution layer 22 by a solder bump 103. Other configurations of the fourth embodiment are similar to those of the first embodiment.

According to the semiconductor device 1 of the fourth embodiment, by making use of a fact that a thermal expansion coefficient of a glass substrate 11 matches with that of silicon, it is possible to realize miniaturization and high reliability of bump connection between packages.

In the fourth embodiment also, in a cavity 17, an opening width of a wiring layer non-formed region 21 in which a wiring layer 14 is not formed for the glass substrate 11 is made wider than a width of a glass opening 32 of the glass substrate 11. Therefore, as described with reference to FIGS. 2A and 2B, reliability of a redistribution layer 22 formed on an entire lower surface may be improved.

Furthermore, a plurality of through holes 19A is formed in a part of the resin 20 covering the electronic component 18, and a heat radiating conducting material 19 using a high thermal conductivity material is arranged from the upper surface of the electronic component 18 to the uppermost surface of the resin 20, so that heat radiation efficiency may be improved.

Note that, in the second to fourth embodiments illustrated in FIGS. 8 to 10 also, an external terminal 26 may be omitted.

6. Fifth and Sixth Embodiments of Semiconductor Device

Figure 11:
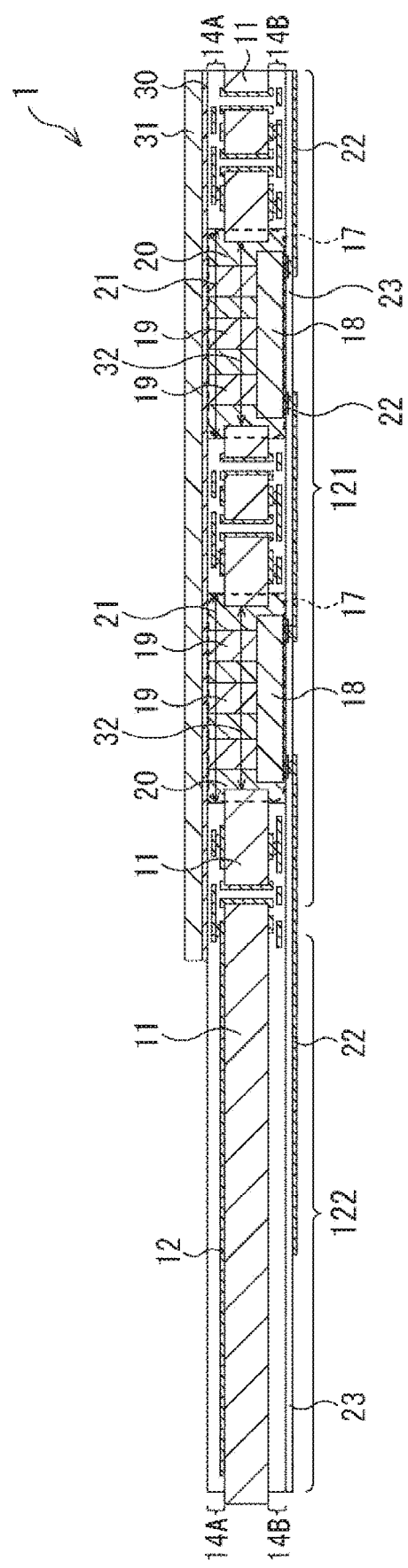
FIG. 11 is a cross-sectional view illustrating a configuration example of a fifth embodiment of a semiconductor device to which the present technology is applied.
Figure 12:
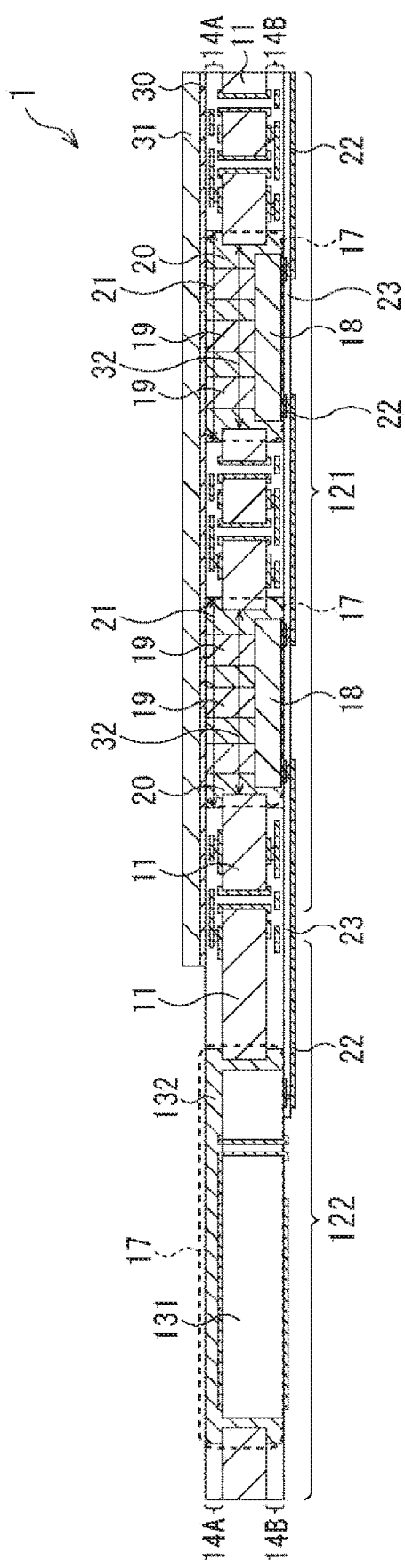
FIG. 12 is a cross-sectional view illustrating a configuration example of a sixth embodiment of a semiconductor device to which the present technology is applied.

FIGS. 11 and 12 are cross-sectional views illustrating configuration examples of fifth and sixth embodiments of a semiconductor device to which the present technology is applied.

FIGS. 11 and 12 illustrate examples in which a semiconductor device 1 is configured as a functional module including a plurality of components. Specifically, FIGS. 11 and 12 illustrate the examples in which the semiconductor device 1 is configured as a high-frequency front-end module.

The semiconductor device 1 as the high-frequency front-end module in FIG. 11 is provided with a circuit block 121 and an antenna block 122.

In the circuit block 121, as in the first embodiment described above, wiring layers 14A and 14B are formed on upper and lower surfaces of a glass substrate 11, respectively, one or more cavities 17 are formed in a predetermined region of the glass substrate 11, and an electronic component 18 is arranged in the cavity 17. A plurality of electronic components 18 in the circuit block 121 is, for example, a power amplifier and the like. For each electronic component 18, a heat radiating path is formed by a heat radiating conducting material 19 and a heat sink 31 arranged on an upper surface. Furthermore, in each cavity 17, an opening width of a wiring layer non-formed region 21 is made wider than a width of a glass opening 32. The plurality of electronic components 18 in the circuit block 121 is connected by a redistribution layer 22 through the shortest path.

In contrast, in the antenna block 122, an antenna circuit is configured by the wiring 12 of the wiring layer 14A formed on the upper surface of the glass substrate 11. In addition to the antenna circuit, a filter circuit, a passive element and the like may be formed on the wiring layer 14A using the wiring 12.

A system of the antenna itself might be changed variously depending on a device on which this is mounted. Therefore, as illustrated in FIG. 12, it is also possible to provide the cavity 17 also in the antenna block 122 and arrange an antenna chip 131 in the cavity 17 as is the case with the electronic component 18 of the circuit block 121.

Development of so-called 5G communication modules is being promoted by each company due to a recent increase in communication speed and capacity of portable devices, a demand for a high-speed communication function with low delay accompanying a progress in edge computing and the like. It is said that signal frequency handled by this 5G front-end module is probably around 30 GHz, and consideration to a loss not comparable to several GHz so far is required.

According to the present technology, high-precision wiring 12 and redistribution layer 22 on the glass substrate 11 may be used to connect the electronic components 18 with the shortest path and minimum impedance shift, so that the high-frequency front-end module capable of transmitting and receiving signals with a minimum loss may be realized. Moreover, a power amplifier used as the electronic component 18 in the high-frequency front-end module generates an extremely large amount of heat, so that it is indispensable to form the heat radiating path, and the heat radiating path using the heat radiating conducting material 19 and the heat sink 31 serve effectively.

7. Application Example

The technology according to the present disclosure is applicable to various products. For example, the technology according to the present disclosure may also be realized as a device mounted on any type of mobile body such as an automobile, an electric automobile, a hybrid electric automobile, a motorcycle, a bicycle, a personal mobility, an airplane, a drone, a ship, a robot, a building machine, or an agricultural machine (tractor).

Figure 13:
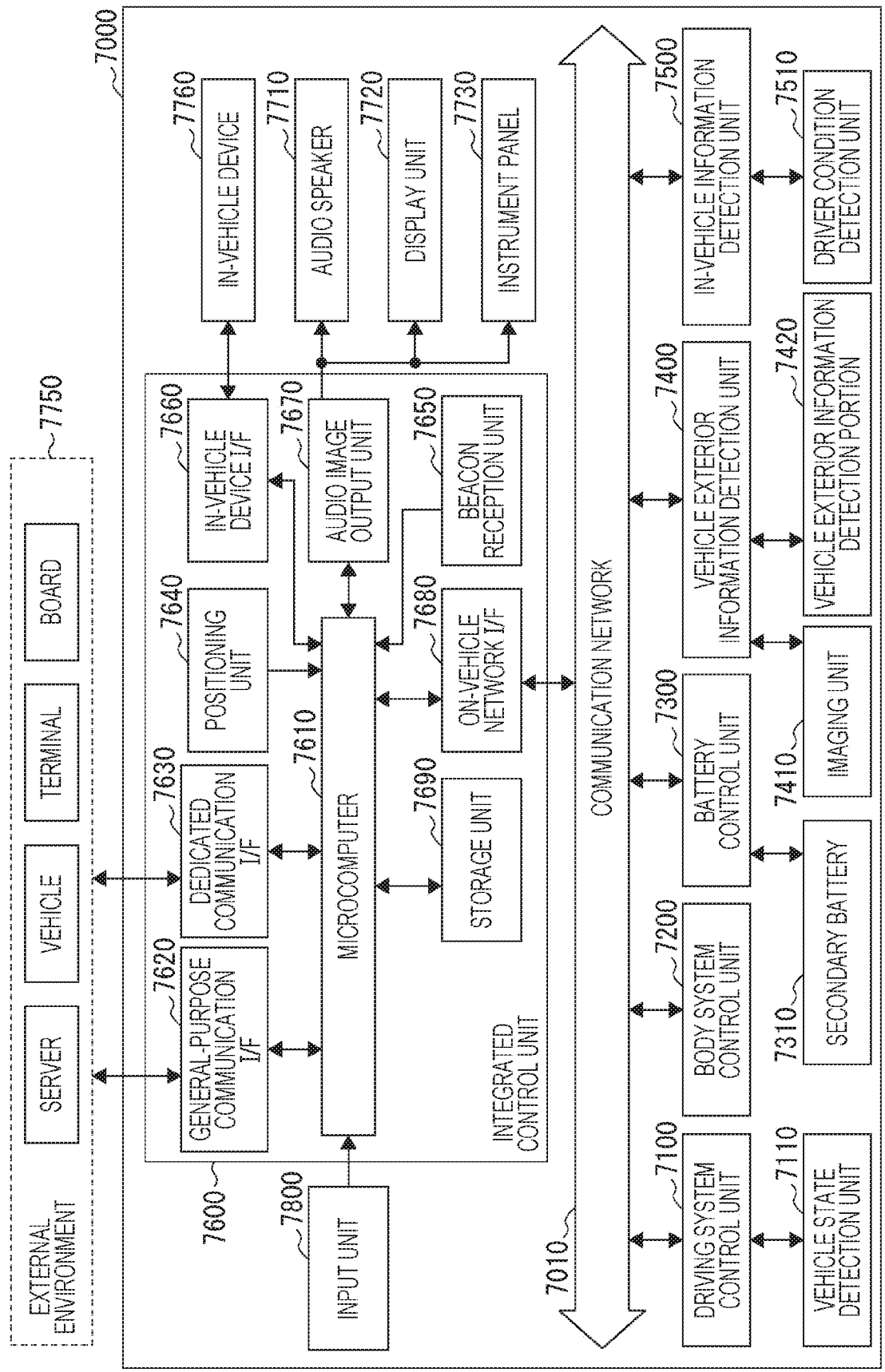
FIG. 13 is a block diagram illustrating an example of a schematic configuration of a vehicle control system.

FIG. 13 is a block diagram illustrating a schematic configuration example of a vehicle control system 7000 that is an example of a mobile body control system to which the technology according to the present disclosure may be applied. The vehicle control system 7000 is provided with a plurality of electronic control units connected to one another via a communication network 7010. In the example illustrated in FIG. 13, the vehicle control system 7000 is provided with a driving system control unit 7100, a body system control unit 7200, a battery control unit 7300, a vehicle exterior information detection unit 7400, an in-vehicle information detection unit 7500, and an integrated control unit 7600. The communication network 7010 that connects a plurality of control units may be, for example, an on-vehicle communication network compliant with any standard such as a controller area network (CAN), a local interconnect network (LIN), a local area network (LAN), or FlexRay (registered trademark).

Each control unit is provided with a microcomputer that performs arithmetic processing according to various programs, a storage unit that stores a program executed by the microcomputer, a parameter used for various arithmetic operations or the like, and a driving circuit that drives various devices to be controlled. Each control unit is provided with a network I/F for communicating with other control units via the communication network 7010, and a communication I/F for communicating by wired communication or wireless communication with devices, sensors or the like inside and outside the vehicle. In FIG. 13, as a functional configuration of the integrated control unit 7600, a microcomputer 7610, a general-purpose communication I/F 7620, a dedicated communication I/F 7630, a positioning unit 7640, a beacon reception unit 7650, an in-vehicle device I/F 7660, an audio image output unit 7670, an on-vehicle network I/F 7680, and a storage unit 7690 are illustrated. Other control units are similarly provided with a microcomputer, a communication I/F, a storage unit and the like.

The driving system control unit 7100 controls operation of devices related to a driving system of the vehicle according to the various programs. For example, the driving system control unit 7100 serves as a control device such as a driving force generating device for generating driving force of the vehicle such as an internal-combustion engine and a driving motor, a driving force transmitting mechanism for transmitting the driving force to a wheel, a steering mechanism for adjusting a rudder angle of the vehicle, and a braking device for generating braking force of the vehicle. The driving system control unit 7100 may also have a function as a control device such as an antilock brake system (ABS) or an electronic stability control (ESC).

A vehicle state detection unit 7110 is connected to the driving system control unit 7100. The vehicle state detection unit 7110 includes, for example, at least one of a gyro sensor that detects an angular velocity of axial rotational movement of a vehicle body, an acceleration sensor that detects acceleration of the vehicle, or sensors for detecting an operation amount of an accelerator pedal, an operation amount of a brake pedal, a steering angle of a steering wheel, an engine speed, a wheel rotational speed or the like. The driving system control unit 7100 performs arithmetic processing using a signal input from the vehicle state detection unit 7110 to control an internal-combustion engine, a driving motor, an electric power steering device, a brake device or the like.

The body system control unit 7200 controls operation of various devices mounted on the vehicle body in accordance with the various programs. For example, the body system control unit 7200 serves as a control device of a keyless entry system, a smart key system, a power window device, or various types of lights such as a head light, a backing light, a brake light, a blinker, or a fog light. In this case, radio waves or signals of various switches transmitted from a portable device that substitutes for a key may be input to the body system control unit 7200. The body system control unit 7200 receives the input of the radio waves or signals and controls the door lock device, power window device, lights and the like of the vehicle.

The battery control unit 7300 controls a secondary battery 7310 that is a power supply source of the driving motor according to the various programs. For example, information of battery temperature, battery output voltage, remaining battery capacity or the like is input to the battery control unit 7300 from the battery device provided with the secondary battery 7310. The battery control unit 7300 performs arithmetic processing using these signals, and performs temperature adjustment control of the secondary battery 7310 or control of a cooling device and the like provided on the battery device.

The vehicle exterior information detection unit 7400 detects information outside the vehicle equipped with the vehicle control system 7000. For example, the vehicle exterior information detection unit 7400 is connected to at least one of an imaging unit 7410 or a vehicle exterior information detection portion 7420. The imaging unit 7410 includes at least one of a time of flight (ToF) camera, a stereo camera, a monocular camera, an infrared camera, or other cameras. The vehicle exterior information detection portion 7420 includes, for example, at least one of an environment sensor for detecting current weather or climate, or a peripheral information detection sensor for detecting another vehicle, an obstacle, a pedestrian or the like around the vehicle equipped with the vehicle control system 7000.

The environment sensor may be, for example, at least one of a raindrop sensor that detects rainy weather, a fog sensor that detects fog, a sunshine sensor that detects a sunlight degree, or a snow sensor that detects snowfall. The peripheral information detection sensor may be at least one of an ultrasonic sensor, a radar device, or a light detection and ranging (laser imaging detection and ranging) (LIDAR) device. The imaging unit 7410 and the vehicle exterior information detection portion 7420 may be provided as independent sensors or devices, or may be provided as a device in which a plurality of sensors or devices is integrated.

Figure 14:
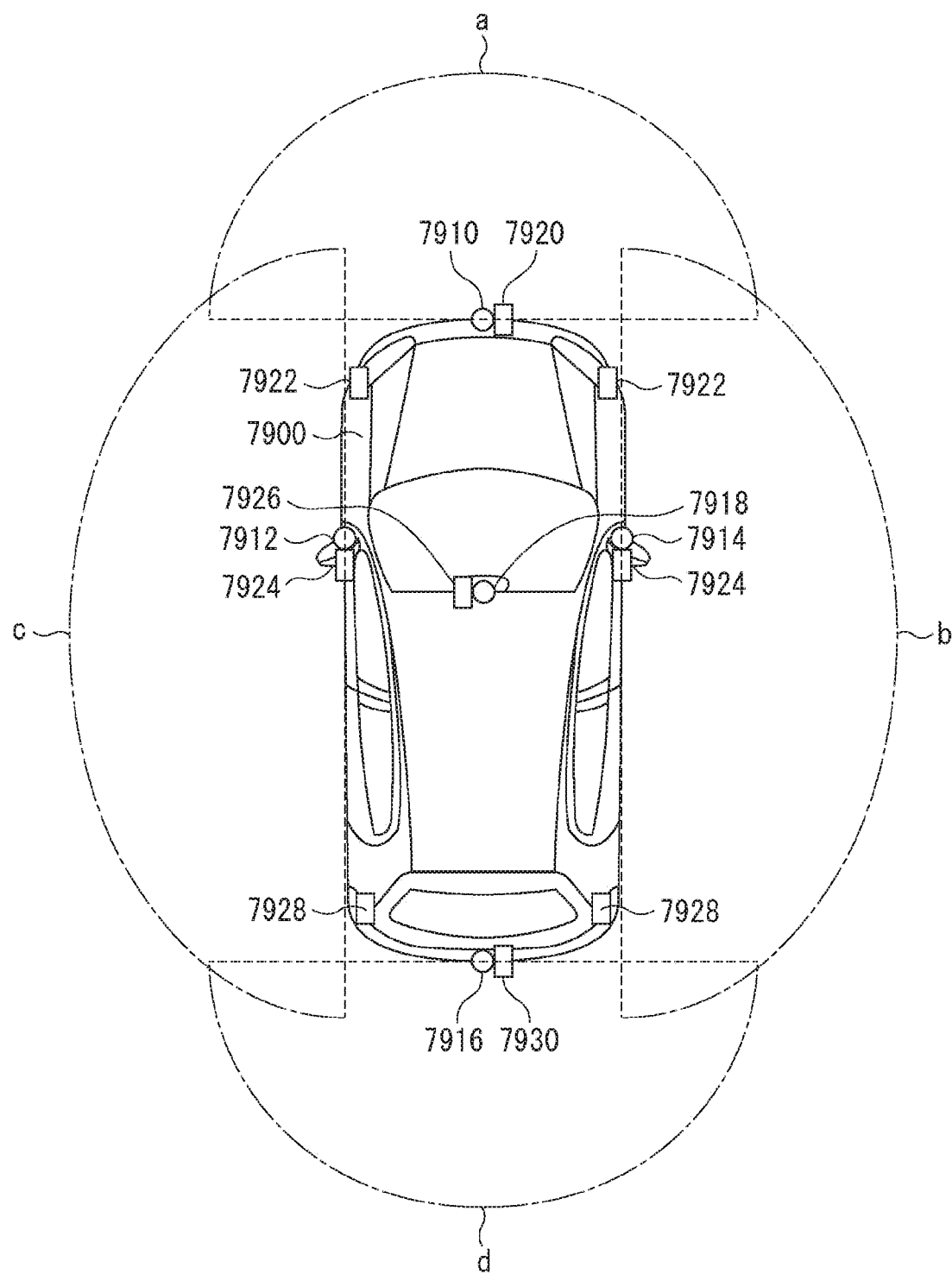
FIG. 14 is an explanatory view illustrating an example of an installation position of a vehicle exterior information detection portion and an imaging unit.

Here, FIG. 14 illustrates an example of an installation position of the imaging unit 7410 and the vehicle exterior information detection portion 7420. Each of imaging units 7910, 7912, 7914, 7916, and 7918 is arranged at least one position of a front nose, a side mirror, a rear bumper, a rear door, and an upper portion of a windshield in a vehicle interior of the vehicle 7900, for example. The imaging unit 7910 provided on the front nose and the imaging unit 7918 provided in the upper portion of the windshield in the vehicle interior principally obtain images in front of the vehicle 7900. The imaging units 7912 and 7914 provided on the side mirrors principally obtain images of the sides of the vehicle 7900. The imaging unit 7916 provided on the rear bumper or the rear door principally obtains an image behind the vehicle 7900. The imaging unit 7918 provided in the upper portion of the windshield in the vehicle interior is principally used for detecting the preceding vehicle, pedestrian, obstacle, traffic signal, traffic sign, lane or the like.

Note that, in FIG. 14, an example of imaging ranges of the imaging units 7910, 7912, 7914, and 7916 is illustrated. An imaging range a indicates the imaging range of the imaging unit 7910 provided on the front nose, imaging ranges b and c indicate the imaging ranges of the imaging units 7912 and 7914 provided on the side mirrors, and an imaging range d indicates the imaging range of the imaging unit 7916 provided on the rear bumper or rear door. For example, image data taken by the imaging units 7910, 7912, 7914, and 7916 are superimposed, and an overhead image of the vehicle 7900 as seen from above is obtained.

Vehicle exterior information detection portions 7920, 7922, 7924, 7926, 7928, and 7930 provided on the front, rear, side, corner, and the upper portion of the windshield of the vehicle interior of the vehicle 7900 may be ultrasonic sensors or radar devices, for example. The vehicle exterior information detection portions 7920, 7926, and 7930 provided on the front nose, rear bumper, rear door, and the upper portion of the windshield in the vehicle interior of the vehicle 7900 may be, for example, LIDAR devices. These vehicle exterior information detection portions 7920 to 7930 are principally used for detecting the preceding vehicle, pedestrian, obstacle or the like.

Returning to FIG. 13, the description is continued. The vehicle exterior information detection unit 7400 allows the imaging unit 7410 to capture an image outside the vehicle and receives captured image data. Furthermore, the vehicle exterior information detection unit 7400 receives detection information from the vehicle exterior information detection portion 7420 connected thereto. In a case where the vehicle exterior information detection portion 7420 is the ultrasonic sensor, radar device, or LIDAR device, the vehicle exterior information detection unit 7400 transmits ultrasonic waves, electromagnetic waves or the like, and receives information of received reflected waves. The vehicle exterior information detection unit 7400 may perform object detection processing of a person, a vehicle, an obstacle, a sign, a character on a road surface or the like or distance detection processing on the basis of the received information. The vehicle exterior information detection unit 7400 may perform an environment recognition processing for recognizing rainfall, fog, a road surface condition or the like on the basis of the received information. The vehicle exterior information detection unit 7400 may calculate a distance to an object outside the vehicle on the basis of the received information.

Furthermore, the vehicle exterior information detection unit 7400 may perform image recognition processing of recognizing the person, vehicle, obstacle, sign, character on the road surface or the like or distance detection processing on the basis of the received image data. The vehicle exterior information detection unit 7400 may perform processing such as distortion correction or position alignment on the received image data, and combine the image data captured by the different imaging units 7410 to generate an overhead image or a panoramic image. The vehicle exterior information detection unit 7400 may perform viewpoint conversion processing using the image data captured by the different imaging units 7410.

The in-vehicle information detection unit 7500 detects information in the vehicle. The in-vehicle information detection unit 7500 is connected to, for example, a driver condition detection unit 7510 that detects a condition of a driver. The driver condition detection unit 7510 may include a camera that images the driver, a biometric sensor that detects biometric information of the driver, a microphone that collects sound in the vehicle interior and the like. The biometric sensor is provided, for example, on a seat surface, a steering wheel or the like and detects biometric information of a passenger who sits on the seat or the driver who holds the steering wheel. The in-vehicle information detection unit 7500 may calculate a driver's fatigue level or concentration level or may determine whether or not the driver is dozing on the basis of detection information input from the driver condition detection unit 7510. The in-vehicle information detection unit 7500 may perform processing such as noise canceling processing on the collected audio signal.

The integrated control unit 7600 controls overall operation in the vehicle control system 7000 according to the various programs. An input unit 7800 is connected to the integrated control unit 7600. The input unit 7800 is realized by a device input operation of which may be performed by the passenger such as a touch panel, a button, a microphone, a switch, or a lever, for example. To the integrated control unit 7600, data obtained by audio recognition of audio input by the microphone may be input. The input unit 7800 may be, for example, a remote control device using infrared rays or other radio waves, or may be an external connection device such as a portable phone or a personal digital assistant (PDA) that supports the operation of the vehicle control system 7000. The input unit 7800 may be, for example, a camera, and in that case, the passenger may input information by gesture. Alternatively, data obtained by detecting motion of a wearable device worn by the passenger may be input. Moreover, the input unit 7800 may include, for example, an input control circuit and the like that generates an input signal on the basis of the information input by the passenger or the like using the above-described input unit 7800 and outputs the same to the integrated control unit 7600. The passenger or the like operates the input unit 7800 to input various data to the vehicle control system 7000 or indicates processing operation.

The storage unit 7690 may include a read only memory (ROM) that stores various programs executed by the microcomputer, and a random access memory (RAM) that stores various parameters, arithmetic results, sensor values or the like. Furthermore, the storage unit 7690 may be realized by a magnetic storage device such as a hard disc drive (HDD), a semiconductor storage device, an optical storage device, a magneto-optical storage device or the like.

The general-purpose communication I/F 7620 is a general-purpose communication I/F that mediates communication with various devices present in an external environment 7750. The general-purpose communication I/F 7620 may be equipped with a cellular communication protocol such as a global system of mobile communications (GSM) (registered trademark), WiMAX (registered trademark), long term evolution (LTE) (registered trademark), or LTE-advanced (LTE-A), or other wireless communication protocol such as wireless LAN (also referred to as Wi-Fi (registered trademark)) and Bluetooth (registered trademark). The general-purpose communication I/F 7620 may be connected to a device (for example, an application server or a control server) present on an external network (for example, the Internet, a cloud network, or an operator-specific network) through, for example, a base station or an access point. Furthermore, the general-purpose communication I/F 7620 may use, for example, a peer to peer (P2P) technology to communicate with a terminal present near the vehicle (for example, a terminal of a driver, a pedestrian, or a store, or a machine type communication (MTC) terminal.

The dedicated communication I/F 7630 is a communication I/F that supports a communication protocol formulated for use in a vehicle. The dedicated communication I/F 7630 may be equipped with a standard protocol such as wireless access in vehicle environment (WAVE) that is a combination of lower-layer IEEE802.11p and upper-layer IEEE1609, dedicated short range communications (DSRC), or the cellular communication protocol, for example. The dedicated communication I/F 7630 typically performs V2X communication that is a concept including one or more of vehicle-to-vehicle communication, vehicle-to-infrastructure communication, vehicle-to-home communication, and vehicle-to-pedestrian communication.

The positioning unit 7640 executes positioning by receiving a GNSS signal from a global navigation satellite system (GNSS) satellite (for example, a GPS signal from a global positioning system (GPS) satellite) for example, and generates position information including latitude, longitude, and altitude of the vehicle. Note that, the positioning unit 7640 may specify a current position by exchanging signals with a wireless access point, or may obtain position information from a terminal such as a portable phone, PHS, or smartphone having a positioning function.

For example, the beacon reception unit 7650 receives radio waves or electromagnetic waves transmitted from a wireless station and the like installed on the road, and obtains information such as the current position, traffic jam, closed road, required time or the like. Note that, the function of the beacon reception unit 7650 may be included in the dedicated communication I/F 7630 described above.

The in-vehicle device I/F 7660 is a communication interface that mediates connection between the microcomputer 7610 and various in-vehicle devices 7760 present in the vehicle. The in-vehicle device I/F 7660 may establish wireless connection using the wireless communication protocol such as wireless LAN, Bluetooth (registered trademark), near field communication (NFC), or wireless USB (WUSB). Furthermore, the in-vehicle device I/F 7660 may establish wired connection such as universal serial bus (USB), high-definition multimedia interface (HDMI) (registered trademark), or mobile high-definition link (MHL) through a connection terminal (and a cable if necessary) not illustrated. The in-vehicle device 7760 may include, for example, at least one of a mobile device or a wearable device that the passenger has, or an information device that is carried in or attached to the vehicle. Furthermore, the in-vehicle device 7760 may include a navigation device that searches for a route to an arbitrary destination. The in-vehicle device I/F 7660 exchanges control signals or data signals with these in-vehicle devices 7760.

The on-vehicle network I/F 7680 is an interface that mediates communication between the microcomputer 7610 and the communication network 7010. The on-vehicle network I/F 7680 transmits and receives signals and the like in accordance with a predetermined protocol supported by the communication network 7010.

The microcomputer 7610 of the integrated control unit 7600 controls the vehicle control system 7000 according to the various programs on the basis of the information obtained by means of at least one of the general-purpose communication I/F 7620, the dedicated communication I/F 7630, the positioning unit 7640, the beacon reception unit 7650, the in-vehicle device I/F 7660, or the on-vehicle network I/F 7680. For example, the microcomputer 7610 may perform arithmetic operation of a control target value of the driving force generating device, steering mechanism, or braking device on the basis of the obtained information inside and outside the vehicle and output a control command to the driving system control unit 7100. For example, the microcomputer 7610 may perform cooperative control for realizing functions of advanced driver assistance system (ADAS) including collision avoidance or impact attenuation of the vehicle, following travel based on the distance between the vehicles, vehicle speed maintaining travel, vehicle collision warning, vehicle lane departure warning or the like. Furthermore, the microcomputer 7610 may perform the cooperative control for realizing automatic driving and the like to autonomously travel independent from the operation of the driver by controlling the driving force generating device, the steering mechanism, the braking device or the like on the basis of the obtained information around the vehicle.

The microcomputer 7610 may generate three-dimensional distance information between the vehicle and an object such as a peripheral structure or a person on the basis of the information obtained by means of at least one of the general-purpose communication I/F 7620, dedicated communication I/F 7630, positioning unit 7640, beacon reception unit 7650, in-vehicle device I/F 7660, or on-vehicle network I/F 7680 and create local map information including peripheral information of the vehicle current position. Furthermore, the microcomputer 7610 may generate a warning signal by predicting a danger such as a vehicle collision, approach of a pedestrian or the like, entry to a closed road or the like on the basis of the obtained information. The warning signal may be, for example, a signal for generating a warning sound or lighting a warning lamp.

The audio image output unit 7670 transmits at least one of audio or image output signals to an output device capable of visually or aurally notifying the passenger of the vehicle or the outside the vehicle of the information. In the example in FIG. 13, as the output device, an audio speaker 7710, a display unit 7720, and an instrument panel 7730 are illustrated. The display unit 7720 may include at least one of an on-board display or a head-up display, for example. The display unit 7720 may have an augmented reality (AR) display function. The output device may also be other devices such as a headphone, a wearable device such as eyeglass-type display worn by the passenger, a projector, or a lamp in addition to these devices. In a case where the output device is a display device, the display device visually displays the results obtained by various types of processing performed by the microcomputer 7610 or the information received from other control units in various formats such as text, image, table, and graph. Furthermore, in a case where the output device is an audio output device, the audio output device converts an audio signal including reproduced audio data, acoustic data or the like into an analog signal and aurally outputs the same.

Note that, in the example illustrated in FIG. 13, at least two control units connected through the communication network 7010 may be integrated as one control unit. Alternatively, each control unit may be configured by a plurality of control units. Moreover, the vehicle control system 7000 may be provided with another control unit not illustrated. Furthermore, in the above description, some or all of the functions of any of the control units may be provided to other control units. That is, as long as the information is transmitted and received through the communication network 7010, predetermined arithmetic processing may be performed by any one of the control units. Similarly, a sensor or a device connected to any one of the control units may be connected to another control unit, and a plurality of control units may transmit/receive detection information to/from each other through the communication network 7010.

In the vehicle control system 7000 described above, the semiconductor device 1 according to each embodiment described above is applicable to the integrated control unit 7600 of the application example illustrated in FIG. 13. For example, the configuration of the semiconductor device 1 illustrated in FIGS. 11 and 12 may be adopted in at least one of the general-purpose communication I/F 7620, dedicated communication I/F 7630, beacon reception unit 7650, or in-vehicle device I/F 7660. For example, by adopting the configuration of the semiconductor device 1 illustrated in FIGS. 11 and 12 as the high-frequency front-end module included in the general-purpose communication I/F 7620, dedicated communication I/F 7630, beacon reception unit 7650, or in-vehicle device I/F 7660, it is possible to provide high heat radiating property while realizing the high-speed communication function with low delay.

The embodiments of the present technology are not limited to the above-described embodiments and various modifications may be made without departing from the gist of the present technology.

For example, it is possible to adopt a combination of all or some of the above-described plurality of embodiments.

Note that, the effects described in this specification are illustrative only and are not limited; the effects other than those described in this specification may also be included.

Note that, the present technology may also have following configurations.

(1)

A semiconductor device including:

a glass substrate on a front surface or front and back surfaces of which a wiring layer including one or more layers of wiring is formed;

an electronic component arranged inside an opening formed on the glass substrate; and a redistribution layer that connects the wiring of the glass substrate and the electronic component.

(2)

The semiconductor device according to (1) described above, in which an opening width of a wiring layer non-formed region that is a region in which the wiring layer is not formed on the front surface or the front and back surfaces of the glass substrate is made wider than an opening width of the opening formed on the glass substrate.

(3)

The semiconductor device according to (1) or (2) described above, in which a region other than the electronic component of the opening formed on the glass substrate is filled with at least resin.

(4)

The semiconductor device according to any one of (1) to (3) described above, in which a heat radiating conducting material is filled on a back surface side of the electronic component on a side opposite to a surface on which a terminal connected to the redistribution layer is formed.

(5)

The semiconductor device according to (4) described above, in which the wiring layer is formed only on the front surface of the glass substrate, and the heat radiating conducting material is filled up to a height to reach the back surface of the glass substrate.

(6)

The semiconductor device according to (4) described above, in which the wiring layer is formed on the front and back surfaces of the glass substrate, and the heat radiating conducting material is filled up to a height to reach the wiring layer on the back surface of the glass substrate.

(7)

The semiconductor device according to any one of (1) to (6) described above, further including:

a heat sink on a back surface side of the glass substrate.

(8)

The semiconductor device according to (7) described above, in which the heat sink is formed by using a conductive material and also serves as a ground terminal.

(9)

The semiconductor device according to any one of (1) to (8) described above, in which a plurality of the openings is formed on the glass substrate, and the electronic component is arranged inside each of the plurality of openings.

(10)

The semiconductor device according to any one of (1) to (9) described above, in which at least one of an antenna circuit, a filter circuit, or a passive element is formed by using the wiring of the wiring layer.

(11)

The semiconductor device according to any one of (1) to (10) described above, in which the electronic component is a component including at least any one of an antenna, a filter, a power amplifier, a switch, a low-noise amplifier, a phase shifter, a mixer, a PLL, or a passive element.

(12)

The semiconductor device according to any one of (1) to (11) described above, in which the wiring layer is formed only on a front surface side of the glass substrate, and a discrete component is further provided on a back surface side of the glass substrate.

(13)

The semiconductor device according to any one of (1) to (11) described above, in which the wiring layer is formed on both the front and back surfaces of the glass substrate, and a semiconductor element is further provided on the wiring layer on a back surface side of the glass substrate.

(14)

A method of manufacturing a semiconductor device, including:

forming a wiring layer including one or more layers of wiring on a front surface or front and back surfaces of a glass substrate;

forming an opening on the glass substrate and arranging an electronic component inside the opening; and forming a redistribution layer that connects the wiring of the glass substrate to the electronic component.

(15)

The method of manufacturing the semiconductor device according to (14) described above, further including:

forming resist that covers the wiring layer on the front surface or the front and back surfaces of the glass substrate; and removing the glass substrate in a region in which the resist is not formed to form the opening on the glass substrate, in which an opening width of the opening formed on the glass substrate is made wider than an opening width of a non-formed region of the resist.

(16)

The method of manufacturing the semiconductor device according to (15) described above, in which a distance in a planar direction from an end face of the opening to an end face of the wiring layer is shorter than a distance in the planar direction from an end face of the resist to the end face of the wiring layer.

(17)

The method of manufacturing the semiconductor device according to any one of (14) to (16) described above, further including:

filling resin on a back surface of the electronic component after arranging the electronic component inside the opening, and further removing a part of the resin to fill a heat radiating conducting material.

(18)

The method of manufacturing the semiconductor device according to any one of (14) to (16) described above, further including:

arranging the electronic component on a back surface of which a block-shaped heat radiating conducting material is adhered inside the opening when arranging the electronic component inside the opening, and filling a space around the block-shaped heat radiating conducting material with resin.

REFERENCE SIGNS LIST

1 Semiconductor device
11 Glass substrate
3 Pixel array unit
12 Wiring
13 Insulating layer
14 (14A, 14B) Wiring layer
15 Through hole
16 Through via
17 Cavity
18 Electronic component
19A Through hole
19 Heat radiating conducting material
20 Resin
21 Wiring layer non-formed region
22 Redistribution layer
23 Insulating layer
25 Terminal
26 External terminal
31 Heat sink
32 Glass opening
42 Non-formed region
71 Heat radiating conducting material
82 Redistribution layer
101 Discrete component
102 Semiconductor element

The invention claimed is:

1. A semiconductor device, comprising:
a wiring layer including a wiring;
a glass substrate including a front surface and a back surface,
wherein the wiring layer is on one of
the front surface of the glass substrate, or
the front surface and the back surface of the glass substrate;
an electronic component in a first region of an opening in the glass substrate,
a resin in a second region of the opening in the glass substrate, wherein the first region is different from the second region;
a heat radiating conducting material in a through hole in the resin; and
a redistribution layer that connects the wiring to the electronic component.

2. The semiconductor device according to claim 1, further comprising a wiring layer non-formed region on the one of the front surface of the glass substrate or the front surface and the back surface of the glass substrate, wherein
an opening width of the wiring layer non-formed region is larger than a width of the opening in the glass substrate, and
the wiring layer is absent in the wiring layer non-formed region.

3. The semiconductor device according to claim 1, wherein
the electronic component comprises a terminal on a surface of the electronic component,
the heat radiating conducting material is on a back surface side of the electronic component,
the back surface side of the electronic component is opposite to the surface, and
the terminal is connected to the redistribution layer.

4. The semiconductor device according to claim 3, wherein
the wiring layer is on the front surface of the glass substrate, and
the heat radiating conducting material is filled up to a height to reach the back surface of the glass substrate.

5. The semiconductor device according to claim 3, wherein
the wiring layer is on the front surface and the back surface of the glass substrate, and
the heat radiating conducting material is filled up to a height to reach the wiring layer on the back surface of the glass substrate.

6. The semiconductor device according to claim 1, further comprising a heat sink on a back surface side of the glass substrate.

7. The semiconductor device according to claim 6, wherein
the heat sink comprises a conductive material, and
the heat sink is configured to serve as a ground terminal.

8. The semiconductor device according to claim 1, further comprising a plurality of electronic components that includes the electronic component, wherein
a plurality of openings is in the glass substrate,
the plurality of openings includes the opening, and
each of the plurality of electronic components is inside a corresponding opening of the plurality of openings.

9. The semiconductor device according to claim 1, wherein at least one of an antenna circuit, a filter circuit, or a passive element corresponds to the wiring of the wiring layer.

10. The semiconductor device according to claim 1, wherein the electronic component includes at least one of an antenna, a filter, a power amplifier, a switch, a low-noise amplifier, a phase shifter, a mixer, a PLL, or a passive element.

11. The semiconductor device according to claim 1, further comprising a discrete component, wherein
the wiring layer is on a front surface side of the glass substrate, and
the discrete component is on a back surface side of the glass substrate.

12. The semiconductor device according to claim 1, further comprising a semiconductor element, wherein
the wiring layer is on both the front surface and the back surface of the glass substrate, and
the semiconductor element is on the wiring layer on a back surface side of the glass substrate.

13. A method of manufacturing a semiconductor device, comprising:
forming a wiring layer on one of a front surface of a glass substrate or the front surface and a back surface of the glass substrate, wherein the wiring layer includes a wiring;
forming a resist that covers the wiring layer;
removing the glass substrate in a non-formed region of the resist for forming an opening in the glass substrate, wherein
the non-formed region is a region in which the resist is not formed, and
an opening width of the opening in the glass substrate is greater than an opening width of the non-formed region of the resist;
arranging an electronic component inside the opening; and
forming a redistribution layer that connects the wiring to the electronic component.

14. The method of manufacturing the semiconductor device according to claim 13, wherein a distance in a planar direction from an end face of the opening to an end face of the wiring layer is shorter than a distance in the planar direction from an end face of the resist to the end face of the wiring layer.

15. The method of manufacturing the semiconductor device according to claim 13, further comprising:
filling a resin on a back surface of the electronic component after arranging the electronic component inside the opening; and
removing a part of the resin to fill a heat radiating conducting material.

16. The method of manufacturing the semiconductor device according to claim 13, further comprising:
arranging the electronic component, on a back surface of which a block-shaped heat radiating conducting material is adhered, inside the opening; and
filling a space around the block-shaped heat radiating conducting material with a resin.

17. A method of manufacturing a semiconductor device, comprising:
forming a wiring layer on one of a front surface of a glass substrate or the front surface and a back surface of the glass substrate, wherein the wiring layer includes a wiring;
forming an opening in the glass substrate;
arranging an electronic component inside the opening;
forming a redistribution layer that connects the wiring to the electronic component;
filling a resin on a back surface of the electronic component after arranging the electronic component inside the opening; and
removing a part of the resin to fill a heat radiating conducting material.

* * * * *